United States Patent
Baek

(10) Patent No.: US 11,037,950 B2
(45) Date of Patent: Jun. 15, 2021

(54) SEMICONDUCTOR MEMORY DEVICE, SEMICONDUCTOR DEVICE, AND METHOD OF MANUFACTURING SEMICONDUCTOR DEVICE

(71) Applicant: Samsung Electronics Co., Ltd., Suwon-si (KR)

(72) Inventor: Seok-Cheon Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/505,111

(22) Filed: Jul. 8, 2019

(65) Prior Publication Data

US 2020/0020702 A1    Jan. 16, 2020

(30) Foreign Application Priority Data

Jul. 16, 2018  (KR) ........................ 10-2018-0082208

(51) Int. Cl.
*H01L 27/1157*  (2017.01)
*H01L 27/11524* (2017.01)
(Continued)

(52) U.S. Cl.
CPC ..... *H01L 27/1157* (2013.01); *H01L 21/31111* (2013.01); *H01L 21/76816* (2013.01); *H01L 21/76877* (2013.01); *H01L 23/5221* (2013.01); *H01L 23/5226* (2013.01); *H01L 23/5283* (2013.01); *H01L 27/11524* (2013.01); *H01L 27/11548* (2013.01); *H01L 27/11556* (2013.01); *H01L 27/11582* (2013.01);
(Continued)

(58) Field of Classification Search
CPC ......... H01L 27/11519; H01L 27/11565; H01L 27/11524; H01L 27/1157
See application file for complete search history.

(56) References Cited

U.S. PATENT DOCUMENTS 6,204,131 B1    3/2001   Shin
7,569,875 B2    8/2009   Suzuki et al.
(Continued)

FOREIGN PATENT DOCUMENTS

KR         10-0279247 B1    1/2001
KR     10-2009-0063848 A    6/2009
KR     10-2017-0046892 A    5/2017

*Primary Examiner* — John A Bodnar
(74) *Attorney, Agent, or Firm* — Muir Patent Law, PLLC

(57) ABSTRACT

A semiconductor memory device includes a substrate including a cell region on which memory sells are disposed and a connection region on which conductive patterns are disposed, the conductive patterns electrically connected to the memory cells; a first word line stack including a plurality of first word lines that are stacked on the substrate in the cell region and extend to the connection region; a second word line stack including a plurality of second word lines that are stacked on the substrate in the cell region and extend to the connection region, the second word line stack being adjacent to the first word line stack; vertical channels disposed on the cell region of the substrate, the vertical channels being connected to the substrate and respectively coupled with the plurality of first and second word lines; a bridge connecting one of the plurality of first word lines in the first word line stack to a corresponding word line of the second word line stack.

20 Claims, 29 Drawing Sheets

(51) Int. Cl.
*H01L 27/11556* (2017.01)
*H01L 27/11582* (2017.01)
*H01L 23/522* (2006.01)
*H01L 23/528* (2006.01)
*H01L 21/311* (2006.01)
*H01L 21/28* (2006.01)
*H01L 21/768* (2006.01)
*H01L 27/11548* (2017.01)
*G11C 16/26* (2006.01)
*G11C 16/04* (2006.01)
*G11C 16/08* (2006.01)

(52) U.S. Cl.
CPC .. *H01L 29/40114* (2019.08); *H01L 29/40117* (2019.08); *G11C 16/0483* (2013.01); *G11C 16/08* (2013.01); *G11C 16/26* (2013.01)

(56) References Cited

U.S. PATENT DOCUMENTS

| | | |
|---|---|---|
| 7,867,870 B2 | 1/2011 | Jang |
| 9,865,540 B2 | 1/2018 | Kim et al. |
| 2017/0148517 A1* | 5/2017 | Harari ................. G11C 11/5635 |
| 2017/0301684 A1* | 10/2017 | Park ................. H01L 27/11556 |

\* cited by examiner

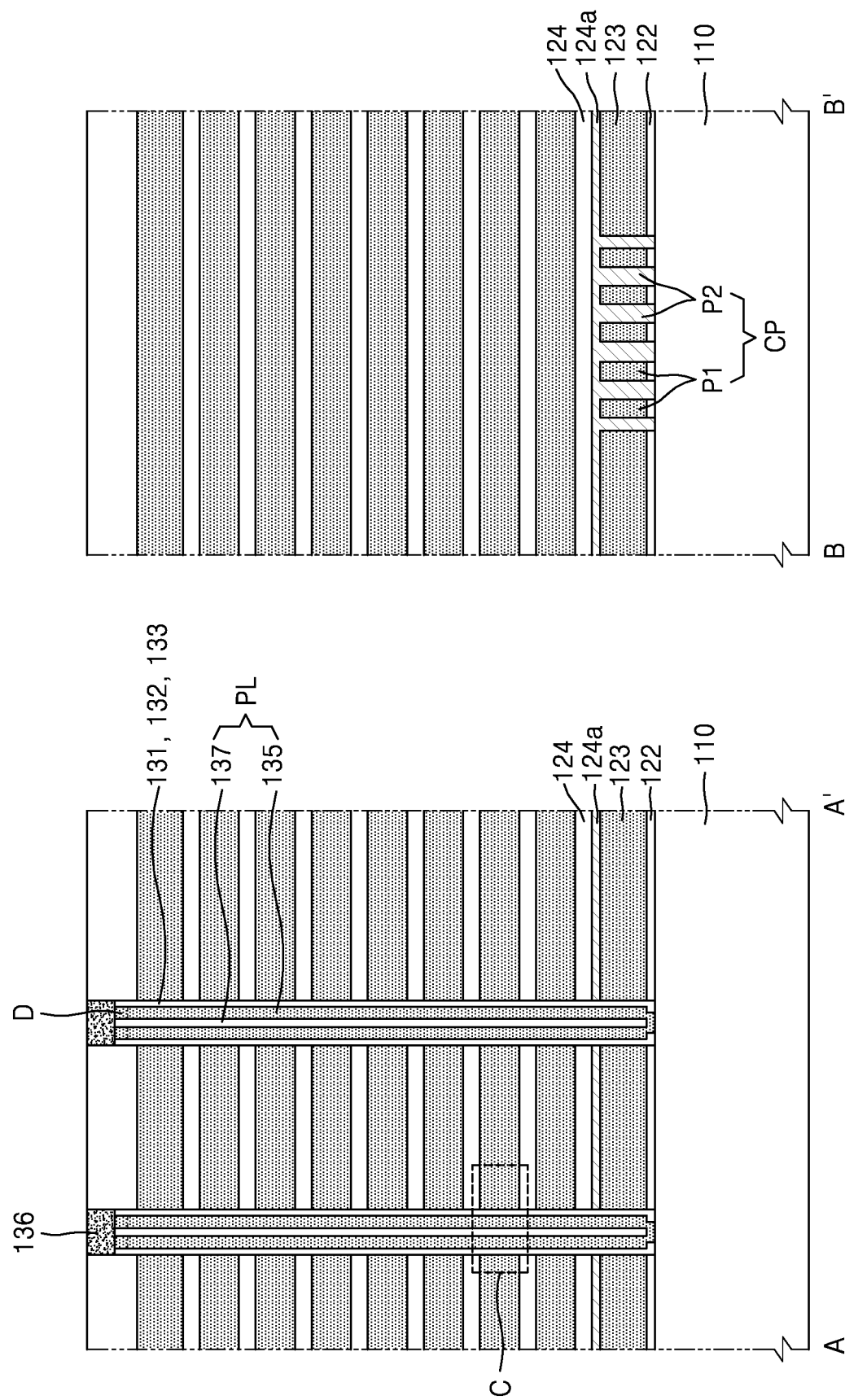

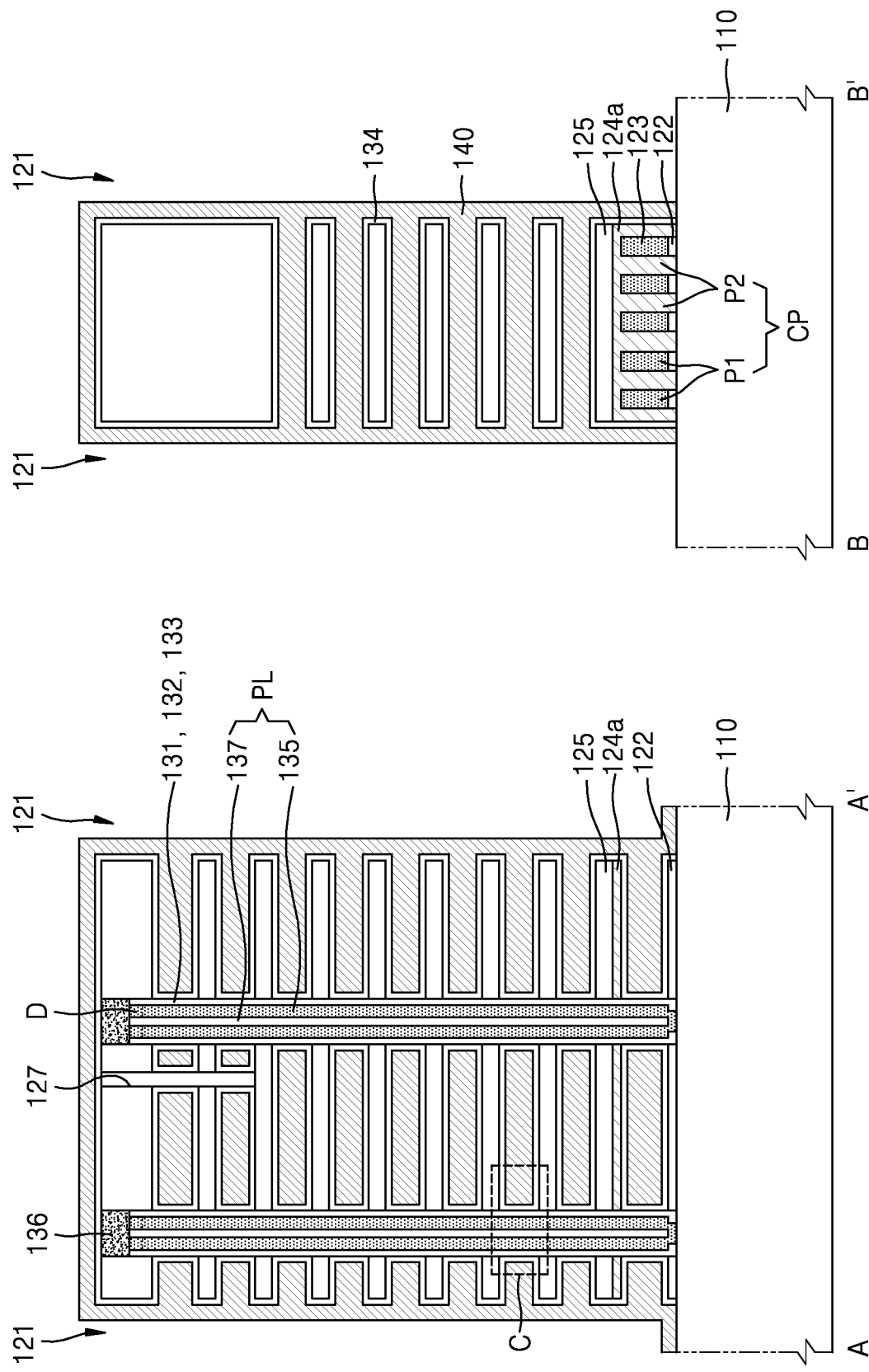

SEMICONDUCTOR MEMORY DEVICE, SEMICONDUCTOR DEVICE, AND METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2018-0082208, filed on Jul. 16, 2018, in the Korean Intellectual Property Office, the disclosure of which is hereby incorporated by reference in its entirety.

BACKGROUND

The inventive concept relates to a semiconductor memory device, a semiconductor device structure, a semiconductor device, and a method of manufacturing a semiconductor device. For example, the disclosure is related to a semiconductor memory device, a semiconductor device structure, and a semiconductor device that may maintain a high operation speed with high reliability and may be manufactured at a low cost.

For highly integration of semiconductor devices, there have been suggested vertical semiconductor devices including a vertical and horizontal array of memory cells arranged in three dimensions. Various methods of increasing the operation speed of semiconductor devices have been suggested recently. However, such methods may reduce the reliability and/or durability of a semiconductor device, or may require costly processes. Therefore, there is a high demand for a method of manufacturing a semiconductor device that has a high operation speed and improved reliability at reduced cost.

SUMMARY

The disclosed embodiments provide a semiconductor memory device that may maintain a high operation speed, high reliability and may be manufactured at reduced cost.

The disclosed embodiments provide a semiconductor structure that may maintain a high operation speed, high reliability and may be manufactured at reduced cost.

According to an aspect of the inventive concept, there is provided a semiconductor memory device including: a substrate including a cell region on which memory cells are disposed and a connection region on which conductive patterns are disposed, the conductive patterns electrically connected to the memory cells; a first word line stack including a plurality of first word lines that are stacked on the substrate in the cell region and extend to the connection region; a second word line stack including a plurality of second word lines that are stacked on the substrate in the cell region and extend to the connection region, the second word line stack being adjacent to the first word line stack; vertical channels disposed on the cell region of the substrate, the vertical channels being connected to the substrate and respectively coupled with the plurality of first and second word lines; a bridge connecting one of the plurality of first word lines in the first word line stack to a corresponding word line of the second word line stack; and a first pattern formed between a first ground selection line (GSL) and a second GSL, wherein the first pattern and the bridge overlaps in a plan view, and wherein the first pattern includes a sub-pattern spaced apart from at least one of the two GSLs in a horizontal direction.

According to another aspect of the inventive concept, there is provided a semiconductor device including: a first and a second conductive patterns extending parallel to a first direction on a semiconductor substrate, the first conductive pattern having a first width and the second conductive pattern having a second width; a first pattern formed between the first and second conductive patterns in a plan view; a first insulating layer formed on the first and second conductive patterns; and a second insulating layer formed on the first insulating layer, wherein the first pattern includes: a sub-pattern having a conductive material different from a material of the first and second conductive patterns; and a first insulator contacting side surfaces of the sub-pattern, wherein the sub-pattern has a narrower width than the first and second widths of the respective first and second conductive patterns.

According to another aspect of the inventive concept, there is provided a semiconductor device including: a first horizontal electrode extending in a first direction on a semiconductor substrate; a second horizontal electrode extending in the first direction and spaced apart from the first horizontal electrode at the same vertical height above the semiconductor substrate as the first horizontal electrode; a first pattern arranged between the first horizontal electrode and the second horizontal electrode to electrically insulate the first horizontal electrode from the second horizontal electrode; and a conductor and an insulator stacked on the first horizontal electrode, the second horizontal electrode, and the first pattern, wherein the first pattern includes a plurality of sub-patterns spaced apart from each other, wherein the sub-patterns are spaced apart from the first and second horizontal electrodes, and wherein the spaced apart distances between adjacent sub-patterns of the plurality of sub-patterns and the respective spaced apart distances between the sub-patterns and the horizontal electrodes are about 3 nm to about 100 nm.

BRIEF DESCRIPTION OF THE DRAWINGS

Embodiments of the inventive concept will be more clearly understood from the following detailed description taken in conjunction with the accompanying drawings in which:

FIGS. 15A to 15J are cross-sectional views for describing a method of manufacturing a semiconductor memory device in order, according to an embodiment;

DETAILED DESCRIPTION

Figure 1:
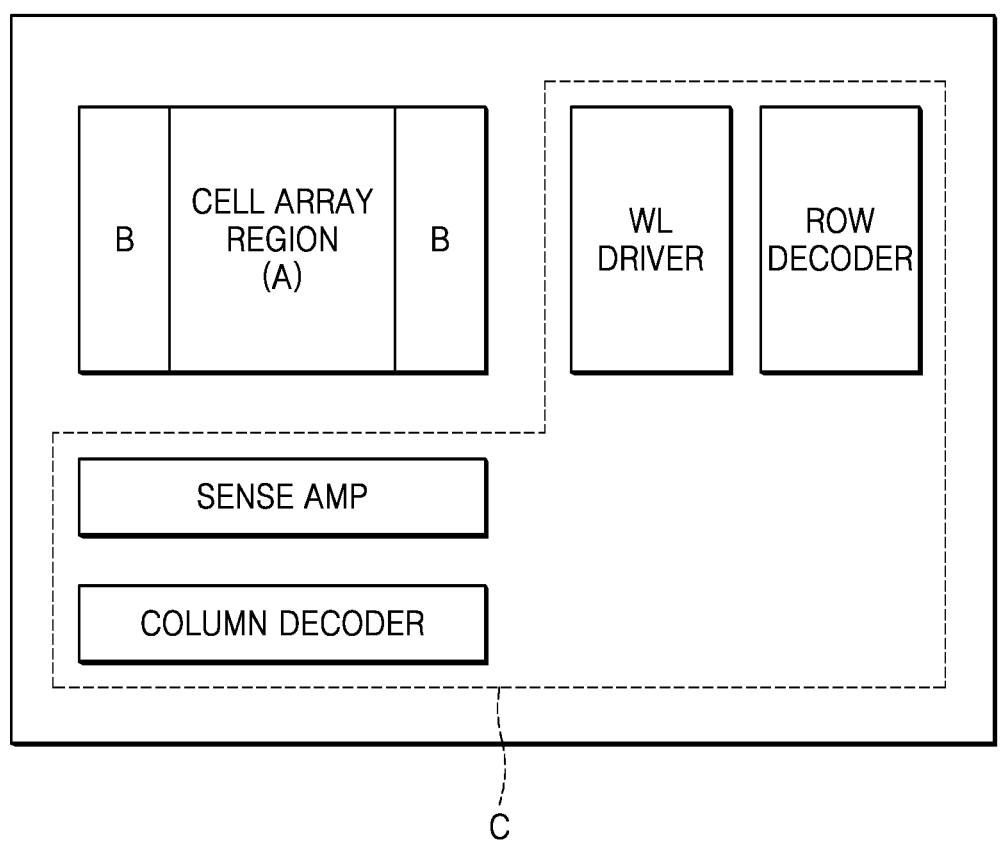
FIG. 1 is a block diagram of a 3-dimensional (3D) semiconductor memory device according to an embodiment.

FIG. 1 is a block diagram of a 3-dimensional (3D) semiconductor memory device according to an embodiment.

Referring to FIG. 1, a 3D semiconductor memory device according to an exemplary embodiment may include a cell array region A, a connection region B, and a peripheral circuit region C.

In the cell array region A, memory cells arranged in three dimensions, and bit lines and word lines, which may be electrically connected with the memory cells, may be formed. In the connection region B, which may be disposed between the cell array region A and the peripheral circuit region C, contact plugs and other wiring that may connect the memory cells to peripheral circuits may be formed. In the peripheral circuit region C, peripheral circuits for driving the memory cells and reading data stored in the memory cells may be formed. For example, in the peripheral circuit region C, a word line (WL) driver, a sense amplifier, a row decoder, a column decoder, and control circuits may be formed.

Figure 2:
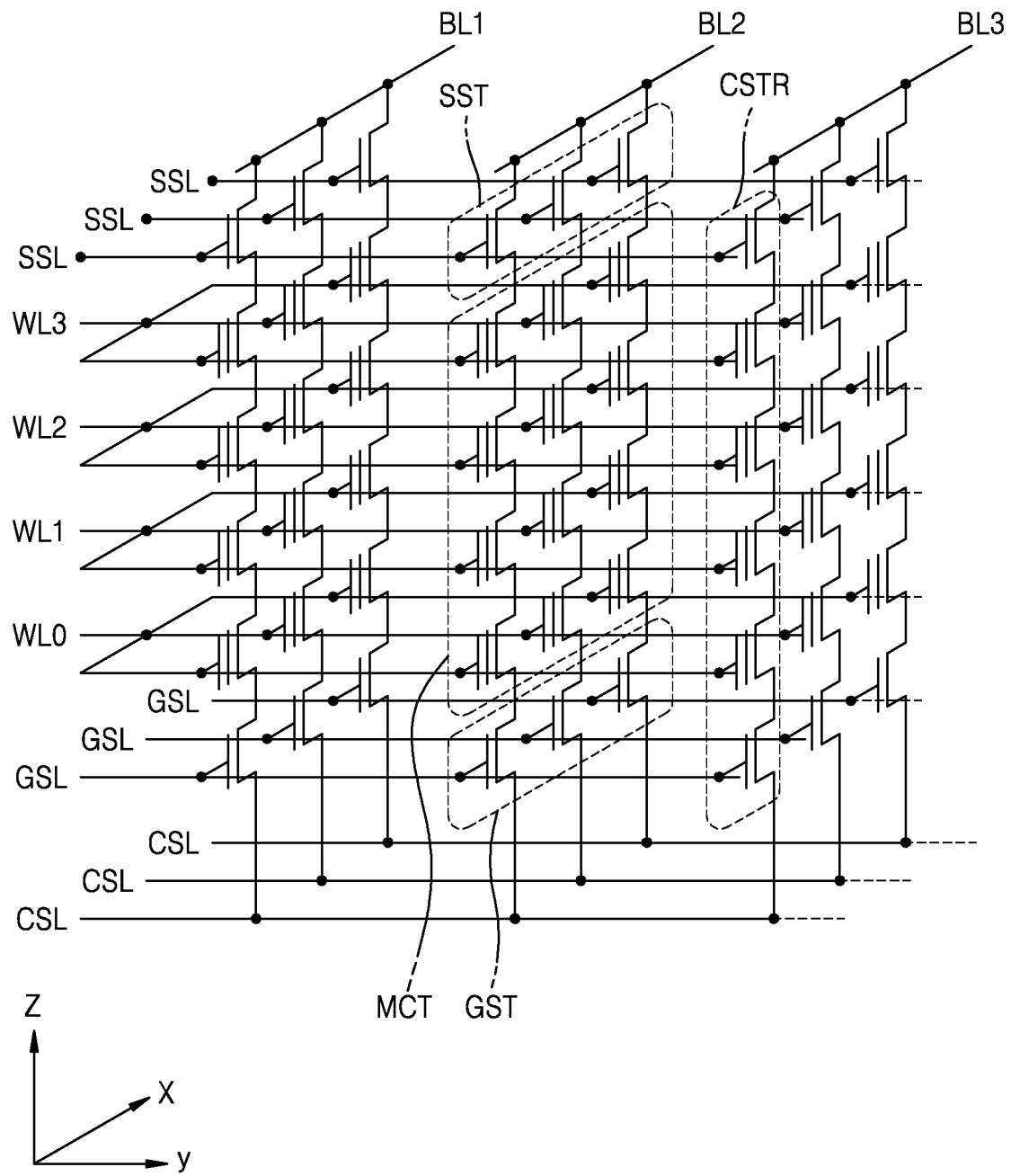
FIG. 2 is a circuit diagram of a cell array of a 3D semiconductor memory device according to an embodiment.
Figure 3:
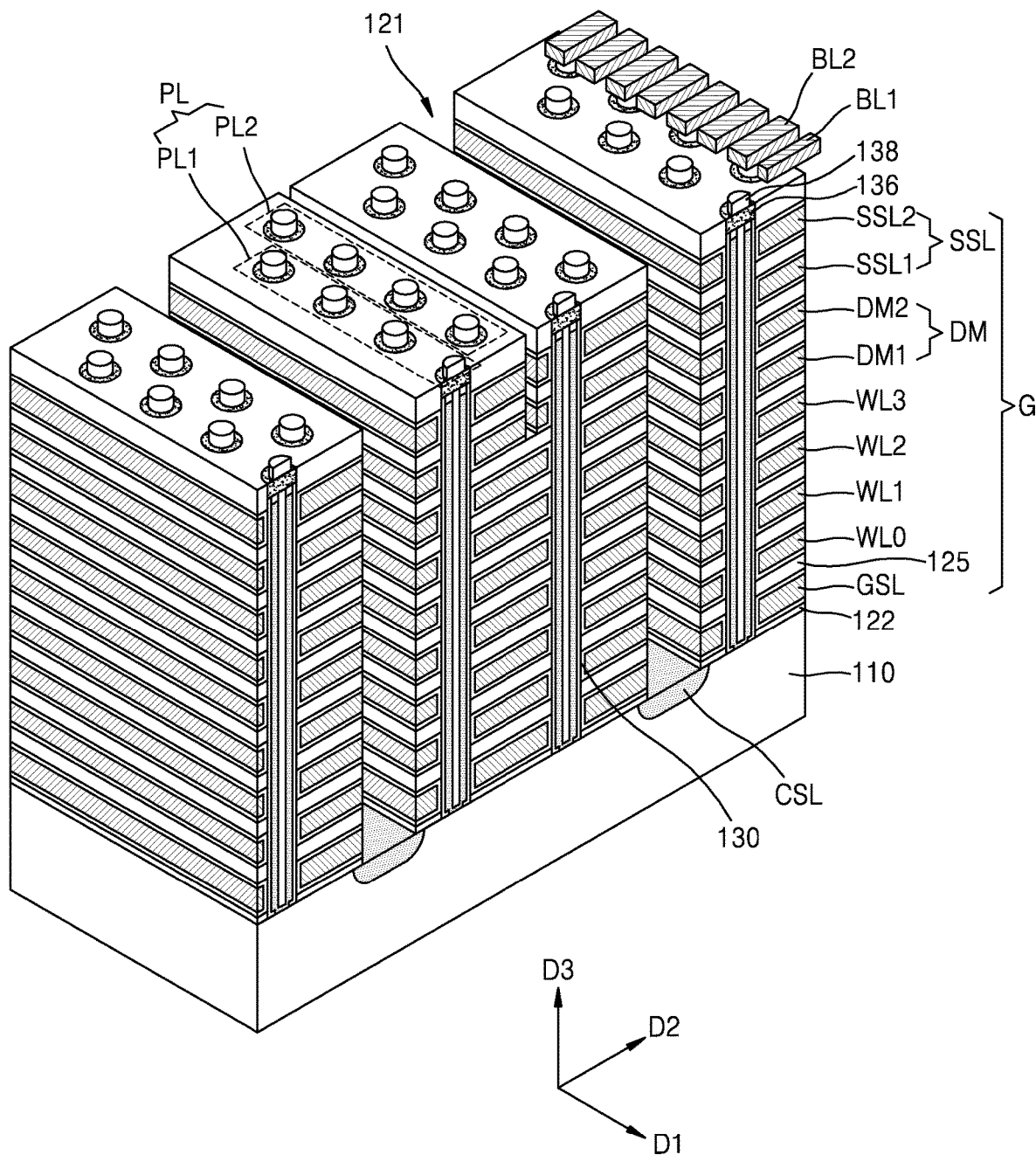
FIG. 3 is a perspective view of a cell array of a 3D semiconductor memory device according to an embodiment.

FIG. 2 is a circuit diagram of a cell array of a 3D semiconductor memory device according to an embodiment. FIG. 3 is a perspective view of a cell array of the 3D semiconductor memory device according to an embodiment.

Referring to FIG. 2, a cell array of a 3D semiconductor memory device according to an embodiment may include a plurality of common source lines CSL, a plurality of bit lines BL, and a plurality of cell strings CSTR disposed between the common source lines CSL and the plurality of bit lines BL.

The plurality of bit lines BL may be arranged in two dimensions and may be connected in parallel to the plurality of cell strings CSTR. For example, plural bit lines BL may arranged in a first direction, each of which may extend in a second direction perpendicular to the first direction.

The plurality of cell strings CSTR may be connected in common to a corresponding common source line CSL. For example, the plurality of cell strings CSTR may be disposed between the plurality of bit lines BL and one common source line CSL. The plurality of common source lines CSL may be arranged in two dimensions. For example, plural common source lines may extend in a first direction and be arranged in a second direction. The same voltage may be electrically applied to the plurality of common source lines CSL. In some embodiments, the plurality of common source lines CSL may be each independently electrically controlled.

Each of the plurality of cell strings CSTR may include a ground selection transistor GST connected to a common source line CSL, a string selection transistor SST connected to a bit line BL, and a plurality of memory cell transistors MCT disposed between the ground selection transistor GST and the string selection transistor SST. The ground selection transistor GST, the string selection transistor SST, and the memory cell transistors MCT may be connected in series to one another.

The common source line CSL may be connected in common to sources of the ground selection transistors GST. Ground selection lines GSL, a plurality of word lines WL0 to WL3, and a plurality of string selection lines SSL, which are disposed between the common source lines CSL and the bit lines BL, may be used as gate electrodes of the ground selection transistors GST, the memory cell transistors MCT, and the string selection transistors SST, respectively. The memory cell transistors MCT may each include a data storage element.

Referring to FIG. 3, a substrate 110 may be provided. The substrate 110 may be a first conductive type, for example, a P type. A buffer dielectric film 122 may be provided on the substrate 110. The buffer dielectric film 122 may include a silicon oxide film such as a middle temperature oxide (MTO) film. Insulating patterns 125 and horizontal electrodes isolated from each other by the insulating patterns 125 may be provided on the buffer dielectric film 122.

The horizontal electrodes may include a ground selection line GSL, first to fourth word lines WL0 to WL3, and string selection lines SSL. The insulating patterns 125 may include silicon oxide films. The thickness of the buffer dielectric film 122 may be less than the thickness of each insulating pattern 125. The horizontal electrodes may include doped silicon, metal (for example, tungsten), metal nitride (for example, titanium nitride), metal silicide, or a combination thereof. For example, each of the horizontal electrodes may include a barrier layer and a metal layer on the barrier layer. The barrier layer may include metal nitride, for example, titanium nitride. The metal layer may include, for example, tungsten.

The insulating patterns 125 and the horizontal electrodes may constitute a gate structure G. The gate structure G may horizontally extend in a first direction D1. A plurality of gate structures G may be provided on the substrate 110. The gate structures G may face one another in a second direction D2 that intersects the first direction D1. The string selection lines SSL may be separated from one another in the second direction D2 and may extend in the first direction D1. Although a gate structure G in FIG. 3 is illustrated as including a plurality of string selection lines SSL1 and SSL2 and one ground selection line GSL, the invention are not limited thereto.

An isolation region 121 that extends in the first direction D1 may be provided between two adjacent gate structures G. Common source lines CSL may be provided in the isolation regions 121 in the substrate 110. The common source lines CSL may be separated from one another and may extend in the substrate 110 in the first direction D1. The common source lines CSL may be a second conductive type, for example, an N type, that is different from the first conductive type. Unlike FIG. 3, the common source lines CSL may be provided between two adjacent ground selection lines GSL on the substrate 110, and may be a line pattern extending in the first direction D1. For example, the ground selection lines GSL may be formed on the substrate 110 with a conductor pattern in certain embodiments.

A plurality of cell columns PL may be connected to the substrate 110 through the horizontal electrodes such as ground selection lines GSL, the first to fourth word lines WL0 to WL3, and the string selection lines SSL. The cell columns PL may have a major axis that may vertically extend upwards from the substrate 110 (i.e., in a third direction D3). An end of each of the cell columns PL may be connected to the substrate 110, and the opposite end thereof may be connected to wirings that extend in the second direction D2. The wirings may include a first wiring BL1 and a second wiring BL2, which may be adjacent to each other and extend in the second direction D2.

A plurality of cell columns PL connected to one string selection line SSL may be in a zig-zag or staggered fashion. The plurality of cell columns PL may include first cell columns PL1 and second cell columns PL2 that may be connected to one string selection line SSL. The first cell columns PL1 may be adjacent to the isolation region 121, whereas the second cell columns PL2 may be relatively away from the isolation region 121. For example, the first cell columns PL1 may be closer to the corresponding isolation region 121 than the second cell columns PL2. The second cell columns PL2 may be shifted from the first cell columns PL1 in the first direction D1 and the second direction D2. The first cell columns PL1 and the second cell columns PL2 may be connected to a first upper wiring BL1 and a second upper wiring BL2, respectively, via conductive patterns 136 and contacts 138.

A plurality of cell strings CSTR may be provided between the first and second upper wirings BL1 and BL2 and the common source lines CSL. The first and second upper wirings BL1 and BL2 may include bit lines of a flash memory device. Each cell string CSTR may include a string selection transistor SST connected to the first and second upper wirings BL1 and BL2, a ground selection transistor GST connected to the common source lines CSL, and a plurality of vertical string memory cells between the string selection transistor and the ground selection transistor. The ground selection line GSL may correspond to a ground selection gate of the ground selection transistor, the first to fourth word lines WL0 to WL3 may correspond to cell gates of the plurality of vertical string memory cells, and the string selection line SSL may correspond to a string selection gate of the string selection transistor. Each cell column PL may include a plurality of memory cells MC. The ground selection gate may be a ground selection gate of a flash memory device. The string selection gate may be a string selection gate of a flash memory device.

A data storage element 130 may be provided between the first to fourth word lines WL0 to WL3 and the cell columns PL. The data storage element 130 may include a charge storage layer. For example, the data storage element 130 may include one of a trap insulating layer, a floating gate electrode, and an insulating layer including conductive nanodots. As illustrated in FIG. 3, the data storage element 130 may extend between the insulating patterns 125 and the first to fourth word lines WL0 to WL3. In some other embodiments, at least a part of the data storage element 130 may extend between the insulating patterns 125 and the cell columns PL. A gate insulating layer, instead of the data storage element 130, may be provided between the string selection lines SSL and the cell columns PL, and between ground selection lines GSL and the cell columns PL. For example, data storage elements 130 may not be formed between the string selection lines SSL and the cell columns PL, and between the ground selection lines GSL and the cell columns PL.

A dielectric layer used as a gate insulating layer of a transistor may be disposed between the ground selection lines GSL and the cell columns PL, or between the string selection lines SSL1 and SSL2 and the cell columns PL. The dielectric layer may be formed of the same material as the data storage element 130. The dielectric layer may include a conventional gate insulating layer for a metal oxide semiconductor field-effect transistor (MOSFET), for example, may include a silicon oxide layer.

In this structure, the cell columns PL may constitute a MOSFET together with the ground selection lines GSL, the first to fourth word lines WL0 to WL3, and the string selection lines SSL1 and SSL2, wherein the cell columns PL may serve as channel regions of the MOSFET. In some other embodiments, the cell columns PL may constitute a metal oxide silicon (MOS) capacitor together with the ground selection lines GSL, the word lines WL0 to WL3, and the string selection lines SSL1 and SSL2.

The ground selection lines GSL and the string selection lines SSL1 and SSL2 may be used as gate electrodes of selection transistors, and the first to fourth word lines WL0 to WL3 may be used as gate electrodes of cell transistors. A fringe field generated by a voltage applied to the ground selection lines GSL, the word lines WL0 to WL3, and the string selection lines SSL1 and SSL2 may form inversion regions in the cell columns PL. A maximum length (or width) of the inversion regions may be greater than a thickness of the first to fourth word lines WL0 to WL3 or the string and the ground selection lines SSL, SSL2, and GSL that form the inversion regions. Accordingly, the inversion regions formed in the cell columns PL may vertically overlap with one another to form a current path through which a selected bit line is electrically connected with the common source line CSL. The cell strings CSTR may have a structure in which the ground selection transistors and the string selection transistors respectively connected to the ground selection lines GSL and the string selection lines SSL1 are connected in series with the memory cell transistors (MCT, see FIG. 2) connected to the word lines WL0 to WL3.

In some embodiments, dummy word lines DM1 and DM2 may be disposed between the string selection lines SSL1 and SSL2 and the first to fourth word lines WL0 to WL3. The dummy word lines DM1 and DM2 may maintain distribution of threshold voltages in the string selection lines SSL1 and SSL2 uniform to prevent reduction in cell current. The dummy word lines described herein may receive certain voltages, but in one embodiment are not written to or read from by a controller.

Figure 4A:
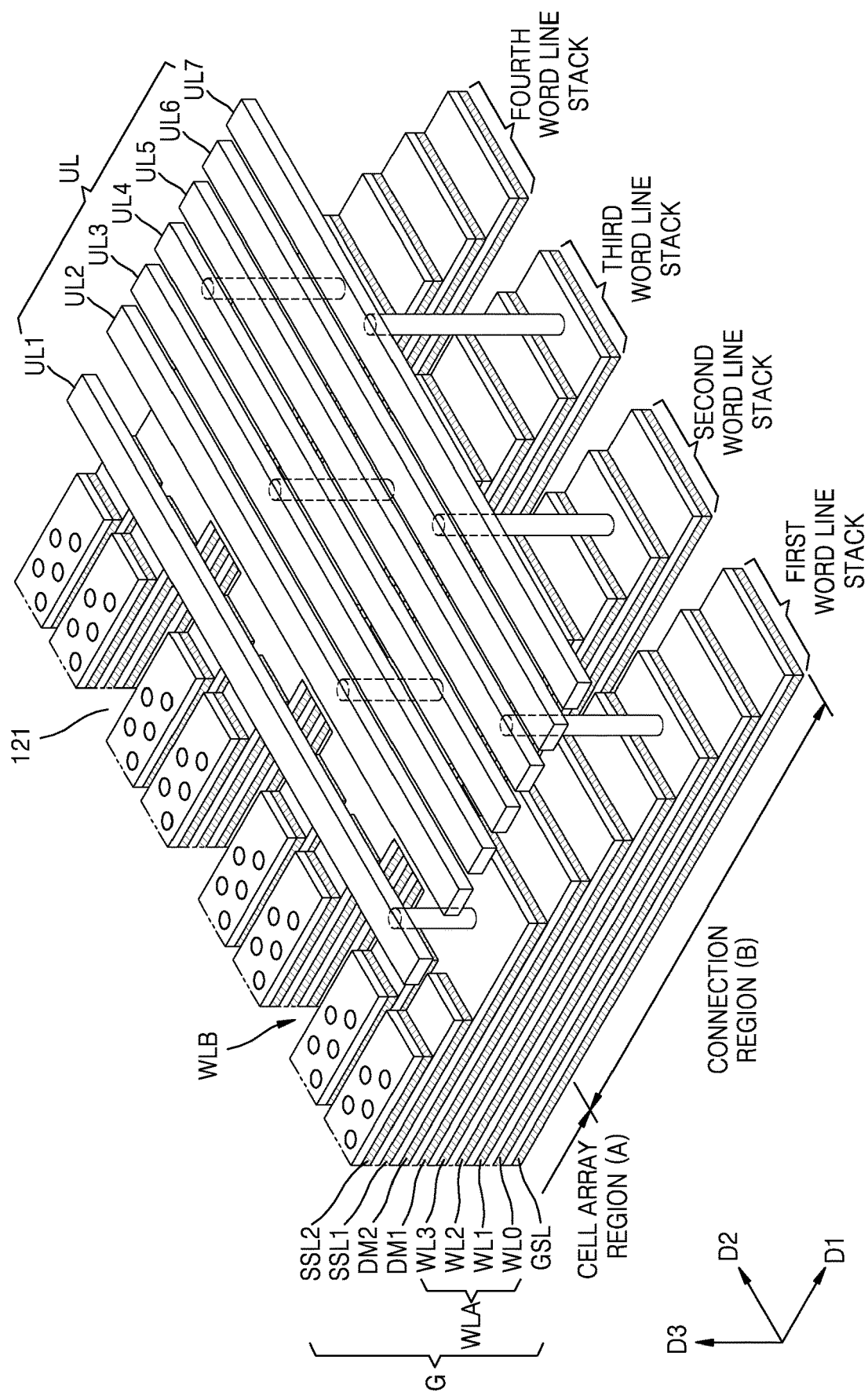
FIG. 4A is a partial perspective view of an end portion of a vertical semiconductor memory device according to an embodiment.
Figure 4B:
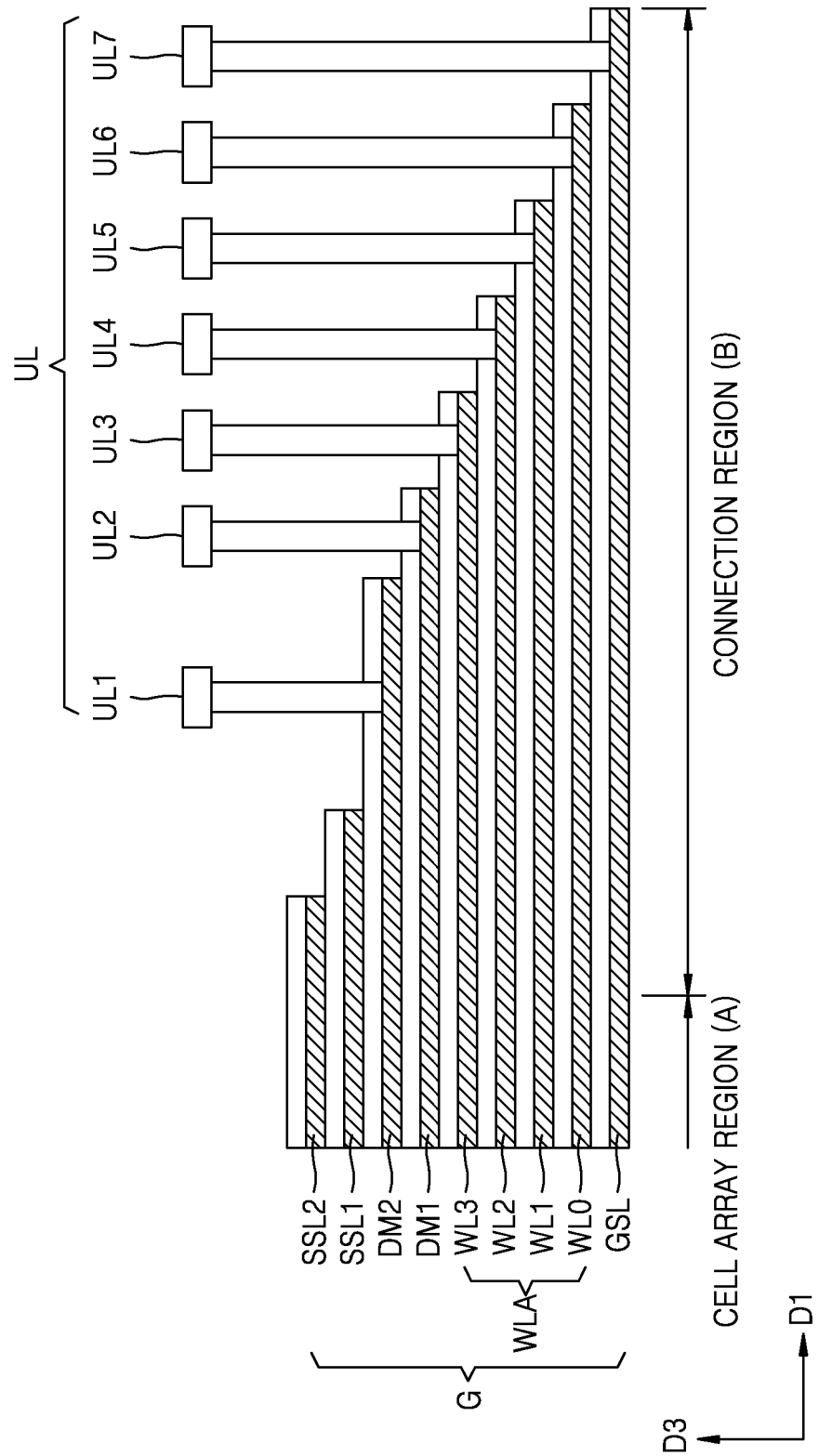
FIG. 4B is a side view of the vertical semiconductor memory device of FIG. 4A taken from a second direction D2.
Figure 5:
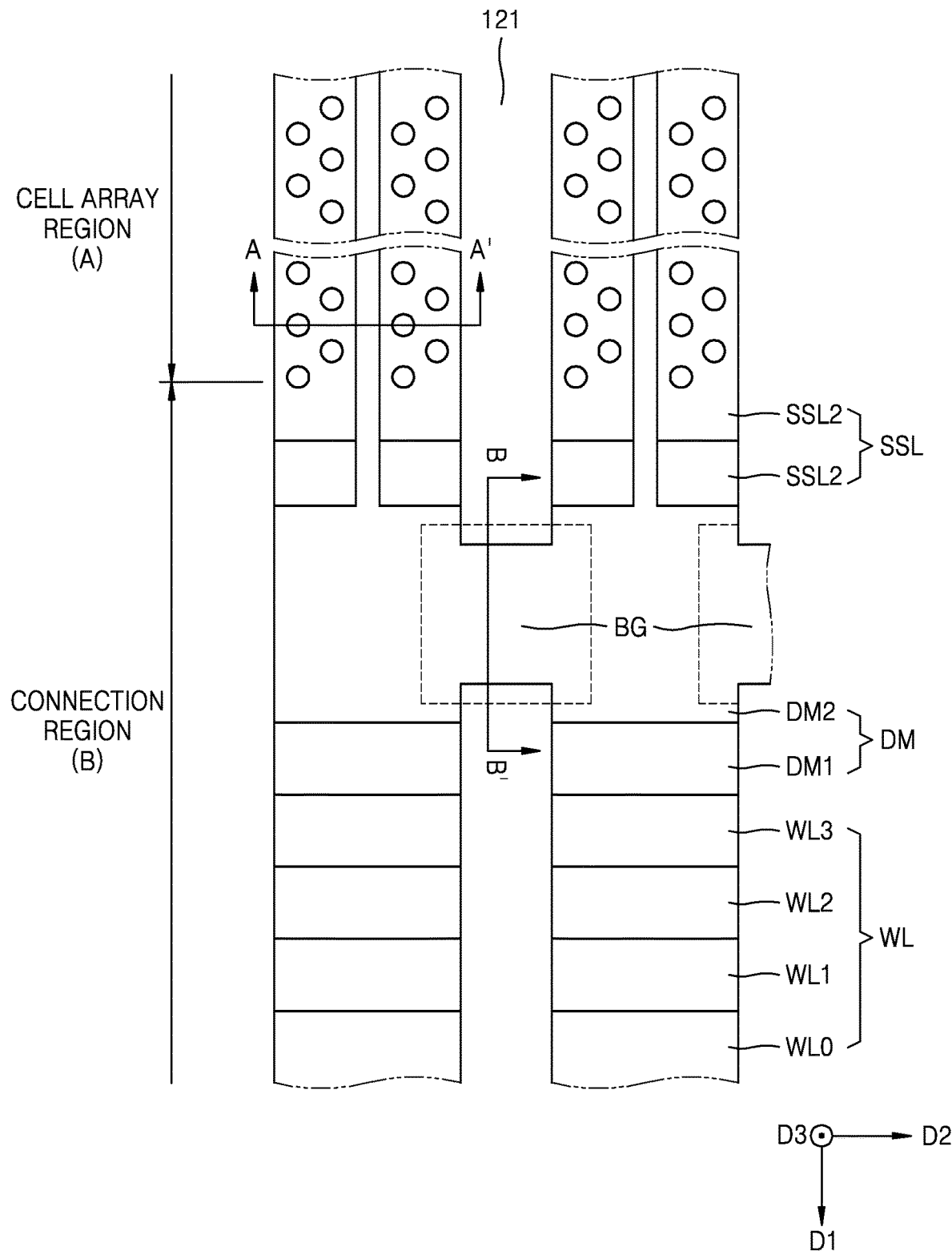
FIG. 5 is a plan view of an end portion of the vertical semiconductor memory device of FIG. 4A.

FIG. 4A is a perspective view of an end portion of a vertical semiconductor memory device according to an embodiment. FIG. 4B is a side view of the vertical semiconductor memory device of FIG. 4A taken from the second direction D2. FIG. 5 is a plan view of an end portion of the vertical semiconductor memory device.

Referring to FIGS. 4A, 4B, and 5, a cell array region A and a connection region B may be adjacent to each other. The arrangement of the connection region B, including contact plugs and wirings that may connect memory cells and peripheral circuits, are arranged adjacent to the cell array region A.

In the connection region B, gate structures G may have a stepwise structure for electrical connection with a peripheral circuit region C (see FIG. 1). In the stepwise structure, the gate structures G may extend in a first direction D1 in a stepwise fashion where the string selection lines SSL2 and SSL1, the dummy word lines DM2 and DM1, the word lines WL3 to WL0, and the ground selection line GSL may extend gradually longer in the stated order and laterally protrude from corresponding upper horizontal electrodes.

The semiconductor memory device may include at least a first word line stack and a second word line stack. The first word line stack may include first word lines WLA stacked on one another in the cell array region A. The second word line stack may include second word lines WLB stacked on one another in the cell array region A. As described above, the first word lines WLA and the second word lines WLB may extend to the connection region B, and end portions thereof may have a stepwise structure. In some embodiments, the end portions of the first word lines WLA and the second word lines WLB in the connection region B may be bent and extend in a third direction D3 that is a vertical direction.

The semiconductor memory device may further include a third word line stack and a fourth word line stack, adjacent to the first word line stack and the second word line stack. Structures of the third word line stack and the fourth word line stack may be substantially the same as the structures of the first word line stack and the second word line stack, and thus a description thereof will not be provided here. For example, each word line stack may include a ground selection line, a plurality of word lines, and a string selection line. In certain embodiments, each word line stack may include a dummy word line.

The first to fourth word line stacks may constitute one memory block. In some embodiments, the first word line stack and the second word line stack may constitute one memory block.

A string selection line SSL of the first word line stack and a string selection line SSL of the second word line stack may be physically and electrically separated from each other.

In the cell array region A, the first word line stack to the fourth word line stack may be separated from one another by the isolation region 121. For example, an isolation pattern may be formed in the isolation region 121. In some embodiments, the first word line stack and the second word line stack may be partially connected to one another in the connection region B. For example, the first to fourth word lines WL0 to WL3 and the dummy word lines DM of the first word line stack may be connected with the word lines WL0 to WL3 and the dummy word lines DM of the second word line stack.

In some embodiments, the first word line stack to the fourth word line stack may be at least partially connected to one another in the connection region B. For example, the first to fourth word lines WL0 to WL3 and the dummy word lines DM of the first word line stack to the fourth word line stack may be connected to each other.

The first word line stack to the fourth word line stack may be connected to one another by bridges BG. For example, the first to fourth word lines WL0 to WL3 of the first word line stack may be connected to the corresponding first to fourth word lines WL0 to WL3 of the second to fourth word line stacks by bridges BG. For example, word lines disposed in different word line stacks may be electrically connected to each other by the bridges BG so that the electrically connected word lines may be applied with the same electric signal while the semiconductor memory device operates. The dummy word lines DM of the first word line stack may be connected to the corresponding dummy word lines DM of the second to fourth word line stacks by bridges BG. For example, dummy word lines DM disposed in different word line stacks may be electrically connected to each other by the bridges BG so that the electrically connected dummy word lines may be applied with the same electric signal while the semiconductor memory device operates. In FIGS. 4A, 4B, and 5, the width of the dummy word line DM2 in the first direction D1 is slightly exaggerated for a clear illustration of the bridges BD. The individual horizontal electrodes may protrude with substantially the same width in the first direction D1. For example, exposed portions of the electrodes by corresponding upper electrodes in the connection region B may have the same width in the first direction D1.

The ground selection line GSL of the first word line stack and the ground selection line GSL of the second word line stack may be physically separated from one another. The ground selection line GSL of the first word line stack may be physically connected to or may be integrated with the ground selection line GSL of the second word line stack. However, when the ground selection line GSL of the first word line stack is physically separated from the ground selection line GSL of the second word line stack, improved electrical characteristics such as high operation speed may be attained.

As described above, the first to fourth word lines WL0-WL3 of the first to fourth word line stacks may be connected to the other word lines WL0 to WL3 of the first to fourth word line stacks by bridges BG. The dummy word lines DM of the first to fourth word line stacks may be connected to the other dummy word lines DM of the first to fourth word line stacks by the bridges BG.

Thus, any one of the first to fourth word lines WL0 to WL3 and the dummy word lines DM of the first to fourth word line stacks may be connected to the peripheral circuit region by only one upper wiring. For example, the word lines WL3 of the first to fourth word line stacks may be connected to the peripheral circuit region only by an upper wiring UL3. Each word line stack does not need an upper wiring for connecting the corresponding layers on the same level to the peripheral circuit region. This is because the word lines of the different word line stacks on the corresponding layer at the same level are connected to one another by a bridge BG.

Such bridges may be formed at the same time as when the isolation regions 121 for isolating the first to fourth word line stacks are formed. However, this may cause the ground selection lines GSL at the lowermost level to be connected by the bridges BG. To prevent this, portions of the ground selection lines GSL that correspond to the bridges BG may be previously removed. While FIG. 4A illustrates that only the ground selection line GSL in the third word stack is connected to the peripheral circuit region by an upper wiring UL7, every ground selection line GSL may be connected to the peripheral circuit with a corresponding upper wiring in some embodiments in that ground selection lines are controlled independently from each other.

Figure 6:
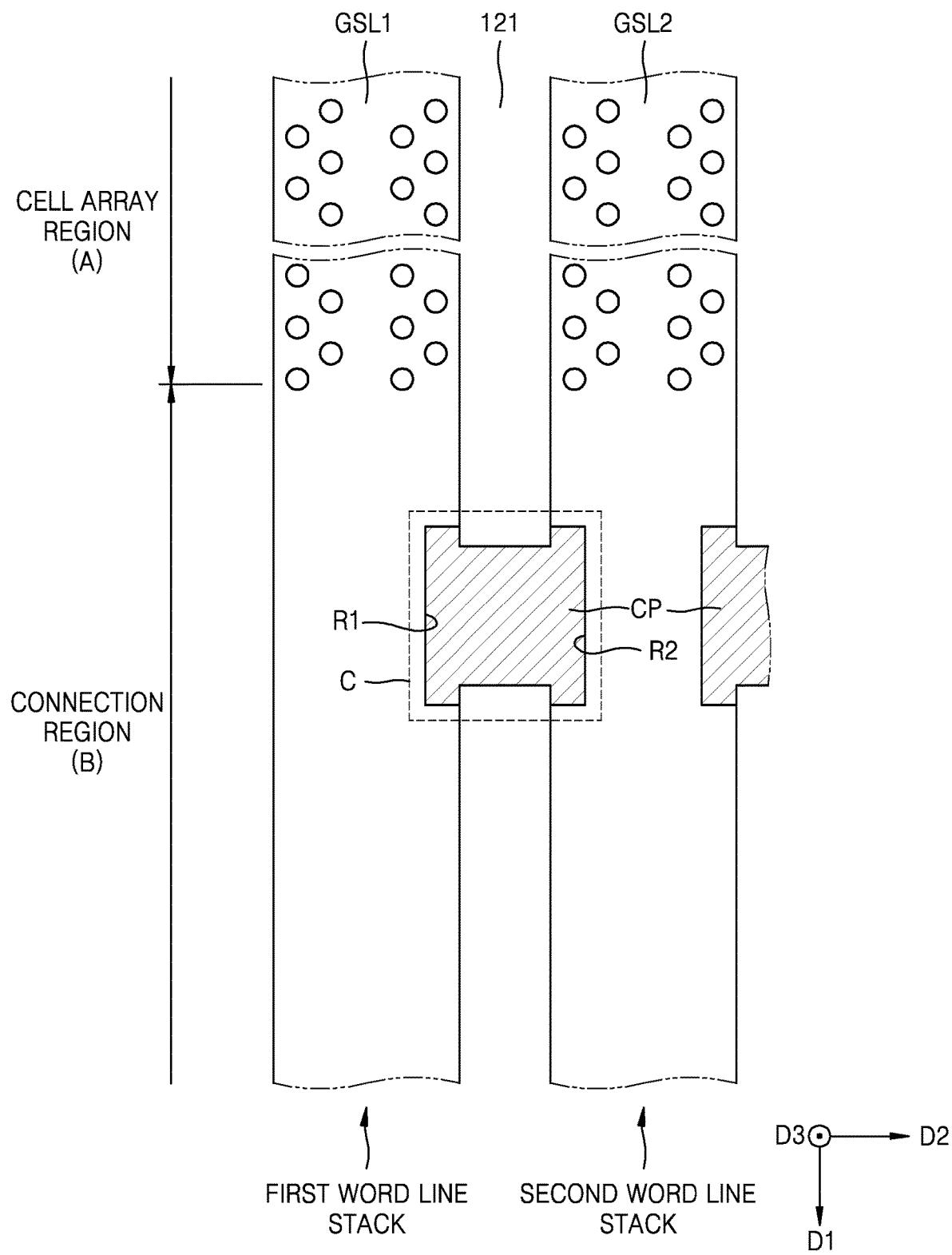
FIG. 6 is a plan view separately showing a ground selection line of a first word line stack and a ground selection line of a second word line stack.

FIG. 6 is a plan view separately showing the first ground selection line GSL1 of the first word line stack and the second ground selection line GSL2 of the second word line stack, according to an example embodiment.

Figure 18:
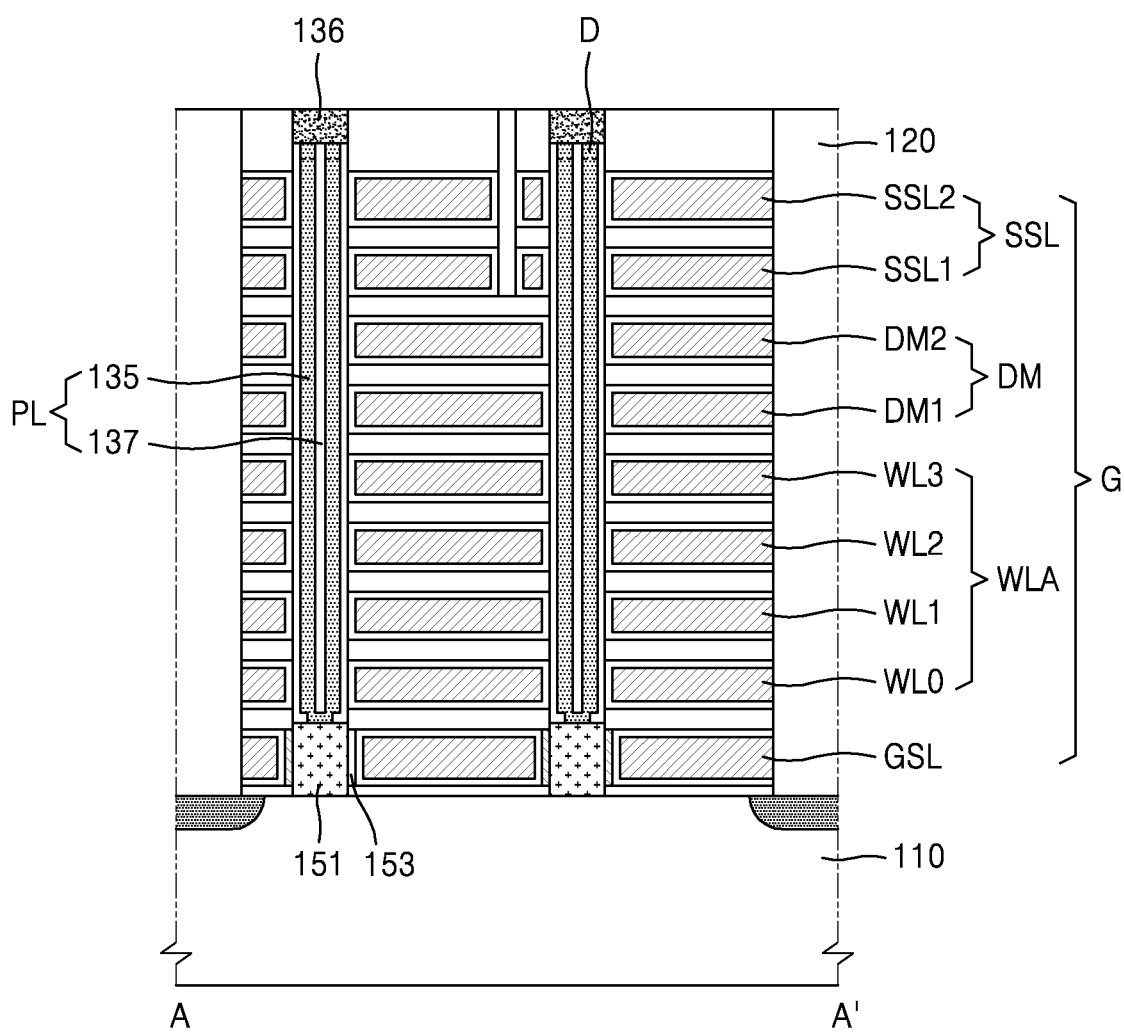
FIG. 18 is a cross-sectional view illustrating a cell column of a semiconductor memory device according to an embodiment.

Referring to FIG. 6, the first ground selection line GSL1 and the second ground selection line GSL2 may be conductive layers that are electrically insulated from each other by a cut pattern CP. In some embodiments, the cut pattern CP may be arranged at a location of the bridge BG (see FIG. 5). For example, the cut pattern CP may be formed below the bridges BG electrically connecting respective word lines WL0-WL3 and/or respective dummy word lines DM1 and DM2 formed in adjacent word line stacks. For example, while the first ground selection line GSL1 and the second ground selection line GSL2 are electrically insulated from each other by the isolation region 121 in which an isolation insulating layer 120 will be formed in a later step as shown in FIG. 18, the cut pattern CP also electrically insulating the first and second ground selection lines GSL1 and GSL2 from each other may be formed between the first and second ground selection lines GSL1 and GSL2.

The cut pattern CP may electrically insulate the first ground selection line GSL1 and the second ground selection line GSL2 from each other. As shown in FIG. 6, an additional ground selection line may be further provided at a right side of the second ground selection line GSL2, and the second ground selection line GSL2 may be electrically insulated from the additional ground selection line at the right side thereof by the cut pattern CP. For example, the cut pattern CP may be a pattern formed between the first and second ground selection lines GSL1 and GSL2 adjacent to each other in a plan view, the first and second ground selection lines GSL1 and GSL2 and the cut pattern CP may be formed on the substrate 110, and the substrate 110 may form step structures with each of the first and second ground selection lines GSL1 and GSL2. For example, the top surface of the substrate 110 and the top surfaces of the first and second ground selection lines GSL1 and GSL2 may have respective step structures. The cut pattern CP may reduce the step structures formed between the substrate 110 and the ground selection lines GSL1 and GSL2. For example, the height between a top surface of the substrate 110 and a top surface of the ground selection lines may be greater than the height between a top surface of the cut pattern CP and a top surface of the ground selection lines GSL1 and GSL2. In certain embodiments, the level of the top surface of the cut pattern CP and the levels of the top surfaces of the ground selection lines GSL1 and GSL2 may be the same or substantially the same.

As shown in FIG. 6, the first ground selection line GSL1 may include a first recess portion R1 contacting at least three side surfaces of the cut pattern CP. The second ground selection line GSL2 may include a second recess portion R2 contacting at least three side surfaces of the cut pattern CP.

The side surfaces of the cut pattern CP and the side surfaces of the bridge BG may be self-aligned because they are obtained by simultaneously etching the same etching mask, as described in detail later.

In FIG. 6, the cut pattern CP has an H-shaped plane (e.g., H-shaped plan view) as an example, but the cut pattern CP may have various planar shapes (e.g., plan views) varying depending on relative sizes between the bridge BG and the cut pattern CP, and the width and length of the isolation region 121. This may be appreciated through a manufacturing method that will be described later.

FIGS. 7A and 8 to 14 are plan views of cut patterns CP according to some embodiments.

Figure 7A:
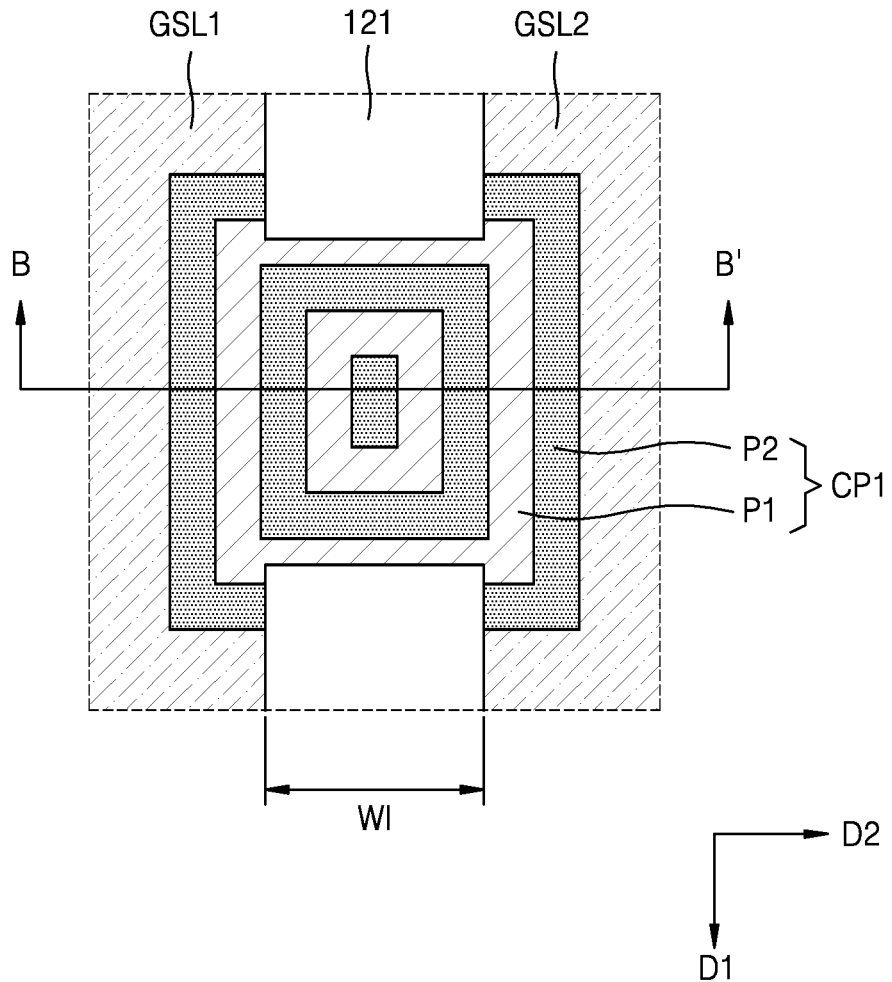
FIG. 7A is a plan view of a cut pattern according to an embodiment.
Figure 7B:
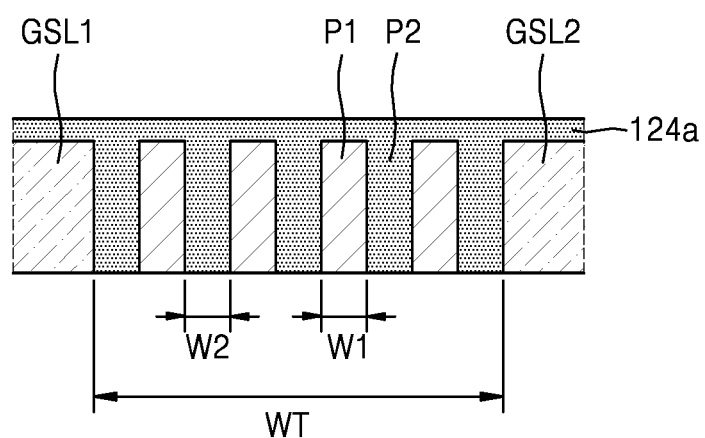
FIG. 7B is a cross-sectional view taken along a line B-B' of FIG. 7A.

FIG. 7A is a plan view of a cut pattern CP1 according to an embodiment, and FIG. 7B is a cross-sectional view taken along a line B-B' of FIG. 7A.

Referring to FIGS. 7A and 7B, the cut pattern CP1 may include a narrow pattern P1. The narrow pattern P1 may have a width W1. The narrow pattern P1 may be electrically insulated from the first ground selection line GSL1 and the second ground selection line GSL2 by a cut pattern insulator P2. The cut pattern insulator P2 may have a width W2. For example, the narrow pattern P1 may be a sub-pattern included in the cut pattern CP1. For example, the cut pattern CP1 may include a plurality of sub-patterns, e.g., a plurality of narrow patterns P1.

In some embodiments, the narrow pattern P1 may include a different material from those of the first ground selection line GSL1 and/or the second ground selection line GSL2. In some embodiments, the narrow pattern P1 may be located at the same level as the first ground selection line GSL1 and/or the second ground selection line GSL2. For example, the cut pattern CP1 may include a plurality of narrow patterns P1 in a plan view and/or in a cross-sectional view.

Here, the 'narrow pattern' may be an arbitrary pattern having a narrower width than those of the first ground selection line GSL1 and/or the second ground selection line GSL2 in the cut pattern CP1. The narrow pattern P1 may be electrically connected to the first ground selection line GSL1 or the second ground selection line GSL2, but is not electrically connected to both the first ground selection line GSL1 and the second ground selection line GSL2. This is because the first ground selection line GSL1 and the second ground selection line GSL2 have to be electrically insulated from each other by the cut pattern CP1. For example, the narrow pattern P1 may be made of a conductive material.

As shown in FIG. 7B, the cut pattern insulator P2 may be embedded in a space in the narrow pattern P1. In some embodiments, the cut pattern insulator P2 may be embedded in a space between the narrow pattern P1 and the first ground selection line GSL1. In some embodiments, the cut pattern insulator P2 may be embedded in a space between the narrow pattern P1 and the second ground selection line GSL2.

In some embodiments, a first insulating layer 124a may be provided on the cut pattern CP1. The first insulating layer 124a may include the same material as that of the cut pattern insulator P2. In some embodiments, the first insulating layer 124a may be integrally formed with the cut pattern insulator P2. For example, the first insulating layer 124a and the cut pattern insulator P2 may form a continuous pattern and there may be no discontinuity (e.g., discontinuity surface) between the first insulating layer 124a and the cut pattern insulator P2.

The first insulating layer 124a may cover upper surfaces of the first ground selection line GSL1 and the second ground selection line GSL2. As will be described in more detail later, the first insulating layer 124a and the cut pattern insulator P2 may be formed simultaneously by an atomic layer deposition (ALD) process. However, the invention is not limited thereto.

Since the first insulating layer 124a and the cut pattern insulator P2 are conformally embedded upward from the space between narrow patterns P1 by the ALD process, a dense material layer without a void therein may be obtained. Also, since the first insulating layer 124a is formed by the ALD process, a substantially flat upper surface may be obtained. Terms s "same", "equal," "flat," "planar," or "coplanar," as used in this disclosure when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" be used herein to emphasize this meaning, unless the context or other statements indicate otherwise. For example, items described as "substantially the same," "substantially equal," "substantially flat," "substantially identical," or "substantially planar," may be exactly the same, equal, flat, identical, or planar, or may be the same, equal, flat, identical, or planar within acceptable variations that may occur, for example, due to manufacturing processes.

A distance between the narrow patterns P1, that is, the width W2 of the cut pattern insulator P2, may have a dimension to be filled with the insulator with a sufficient speed by the ALD process. For example, the distance between the narrow patterns P1 may be about 3 nm to about 100 nm. For the same reason as above, a distance between the narrow pattern P1 and the first ground selection line GSL1 and a distance between the narrow pattern P1 and the second ground selection line GSL2 may be about 3 nm to about 100 nm.

The space between the narrow patterns P1 may have a dimension of about 3 nm to about 100 nm in at least one horizontal direction, e.g., in the first direction D1 or in the second direction D2. When the space between the narrow patterns P1 has a sufficiently narrow dimension in the at least one horizontal direction, the insulator may be embedded with a sufficient speed by the ALD process.

When the space between the narrow patterns P1 is too narrow, an insulating effect by using the cut pattern insulator P2 may be insufficient, and the cut pattern insulator P2 may not be embedded dense. When the space between the narrow patterns P1 is too wide, it takes an excessively long time period to form the cut pattern insulator P2 and it may not be economically efficient.

In FIG. 7A, the narrow pattern P1 is shown to have rectangular patterns as an example, but the invention is not limited thereto.

Also, in FIGS. 7A and 7B, a width WT of the cut pattern CP1 is greater than a width WI of the isolation region 121, but the invention is not limited thereto. In some embodiments, the width WI of the isolation region 121 may be greater than the width WT of the cut pattern CP1. This will be also applied to embodiments that will be described below.

Figure 8:
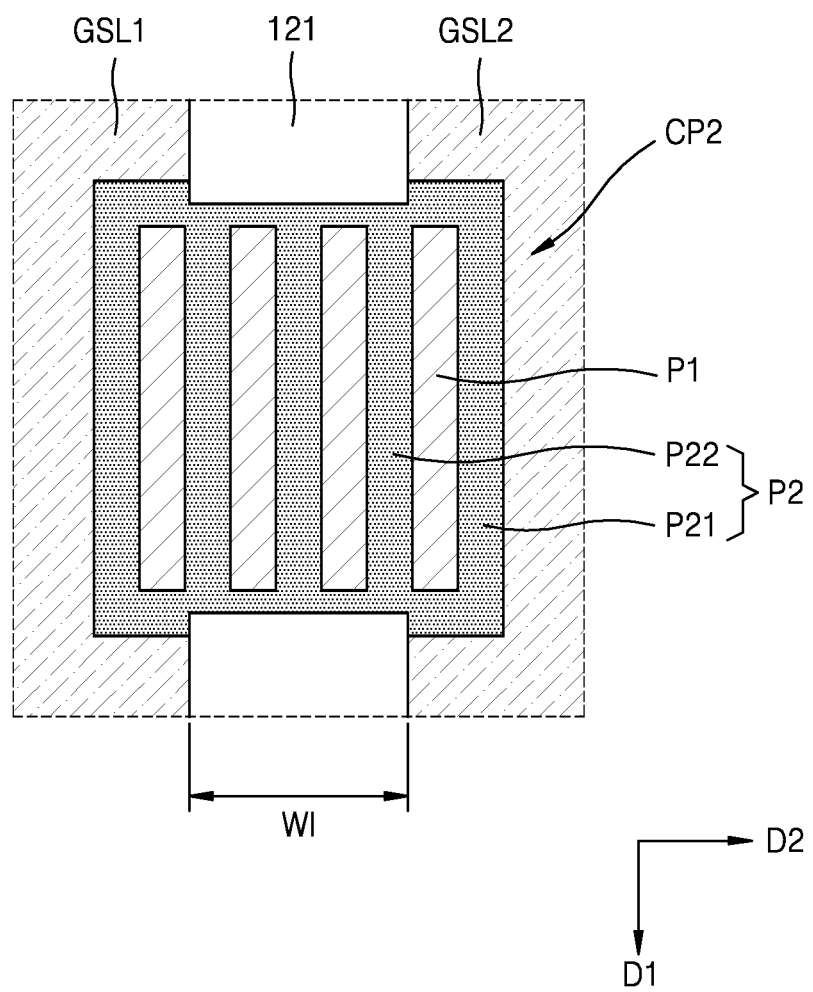
FIGS. 8 to 14 are plan views of cut patterns according to certain embodiments.

FIG. 8 is a plan view of a cut pattern CP2 according to an embodiment.

Referring to FIG. 8, the narrow pattern P1 may include a plurality of line patterns extending in one direction (here, a direction in parallel with the direction D1). The cut pattern insulator P2 may include a surrounding portion P21 extending along a perimeter of the cut pattern CP2. For example, the surrounding portion P21 may form an outermost portion of the cut pattern CP2, and may surround the narrow patterns P1. The cut pattern insulator P2 may include an inside filler P22 filled in between the narrow patterns P1.

Figure 9:
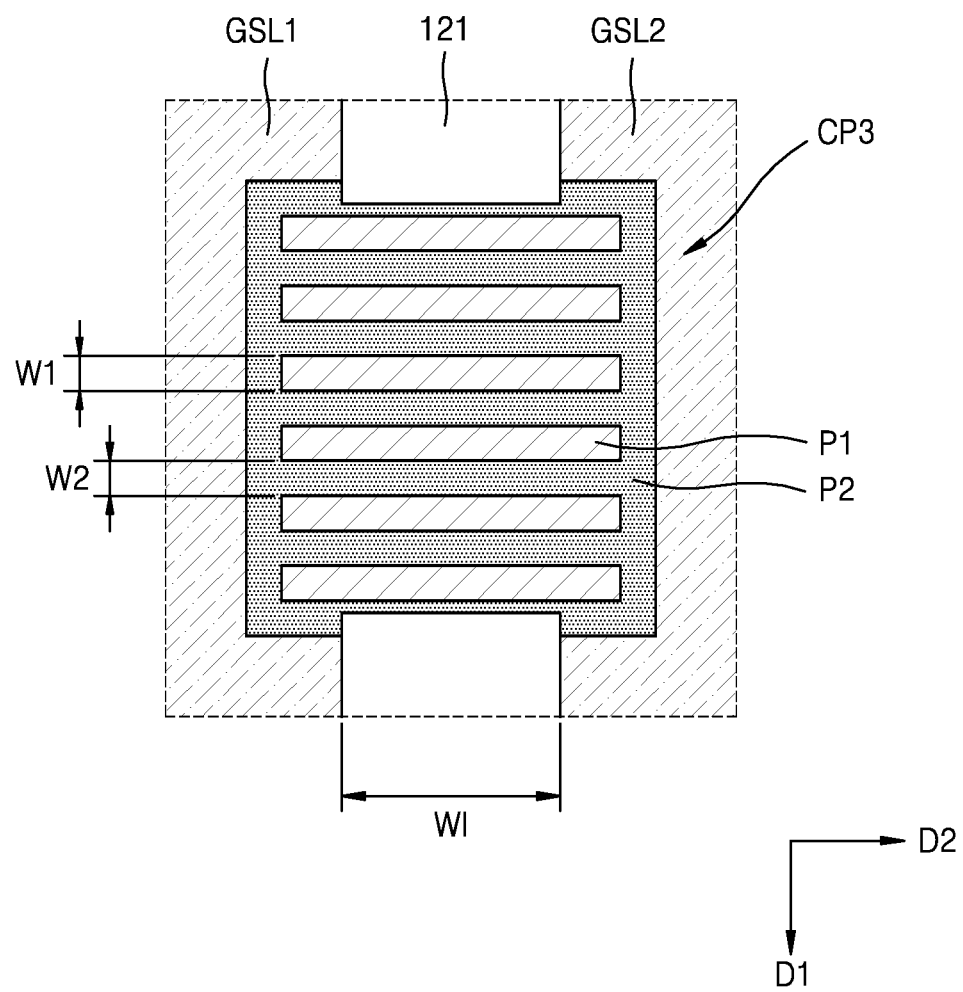

FIG. 9 is a plan view of a cut pattern CP3 according to an embodiment.

Referring to FIG. 9, the narrow pattern P1 may include a plurality of line patterns extending in one direction (here, a direction in parallel with the direction D2). The embodiment illustrated in FIG. 9 is substantially identical with the embodiment illustrated with reference to FIG. 8 except for the direction in which the narrow pattern P1 extends and the number of the line patterns, and thus, additional descriptions thereof are omitted here.

Figure 10:
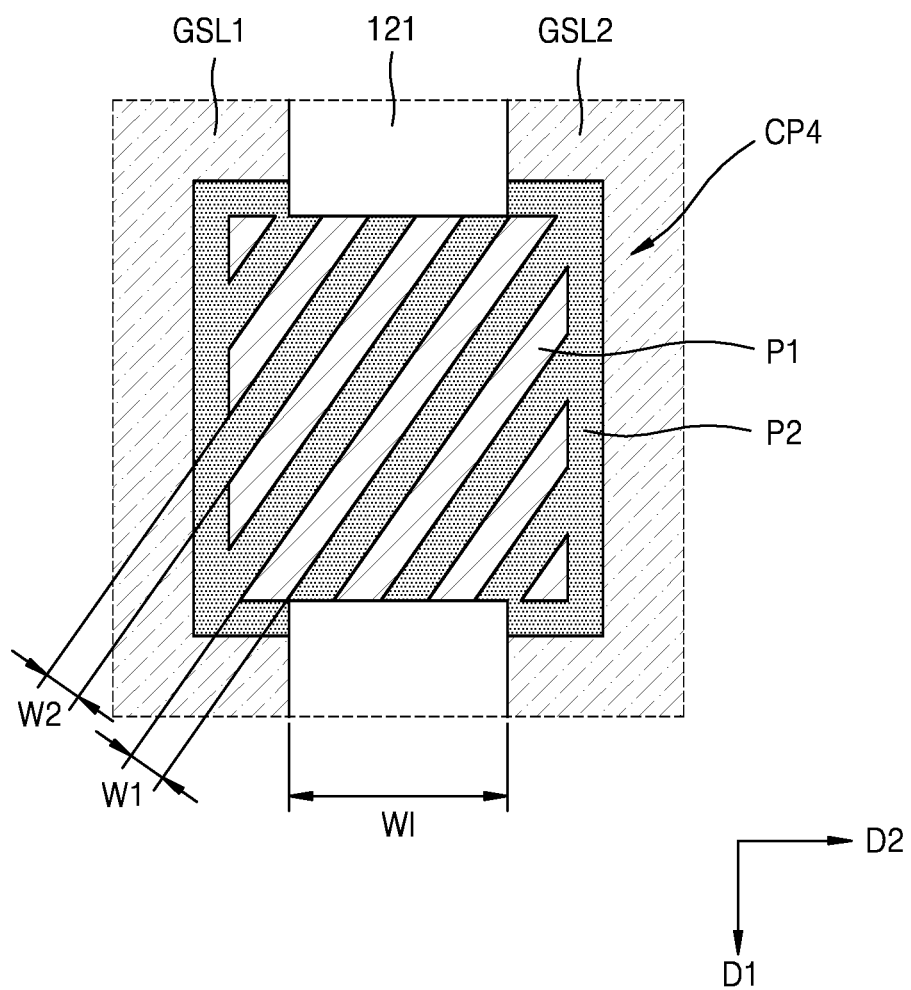

FIG. 10 is a plan view of a cut pattern CP4 according to an embodiment.

Referring to FIG. 10, the narrow pattern P1 may include a plurality of line patterns extending in one direction (here, a direction inclined with respect to directions D1 and D2). The embodiment illustrated in FIG. 10 is substantially identical with the embodiment illustrated with reference to FIG. 8 except for the direction in which the narrow pattern P1 extends and the number and lengths of the line patterns, and thus, additional descriptions thereof are omitted here.

Figure 11:
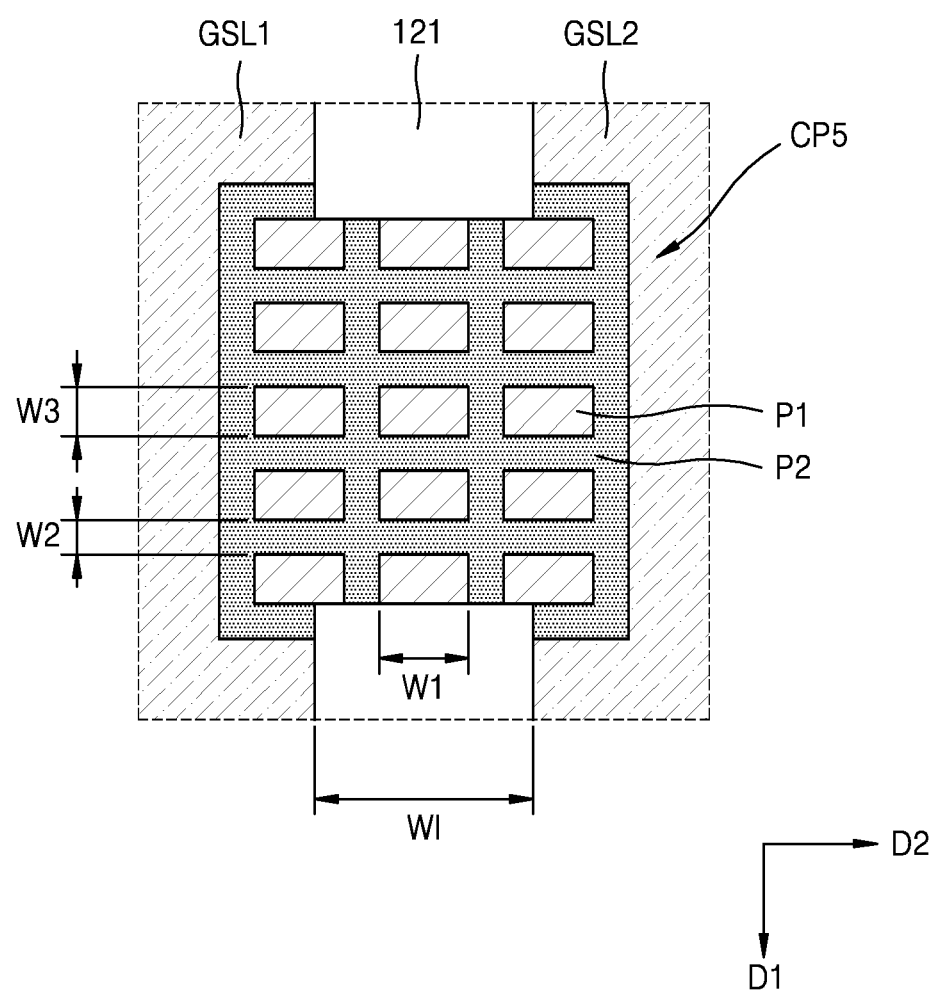

FIG. 11 is a plan view of a cut pattern CP5 according to an embodiment.

Referring to FIG. 11, the narrow pattern P1 may include a plurality of islands (e.g., island patterns). Side surfaces of each of the islands may be surrounded by the cut pattern insulator P2. A dimension of each island in one direction (e.g., in the direction D1) may be W3, and W3 may be greater than W1 (W3>W1, see FIG. 7B).

Figure 12:
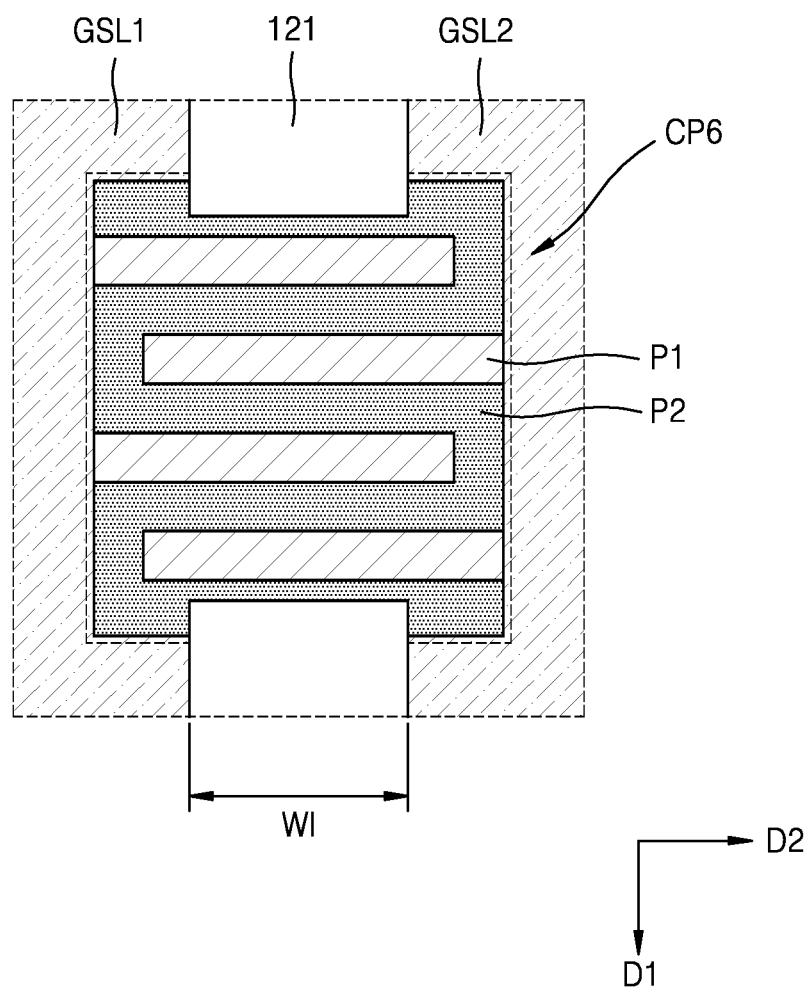

FIG. 12 is a plan view of a cut pattern CP6 according to an embodiment.

Referring to FIG. 12, the cut pattern CP6 may denote a portion indicated by dashed lines. The cut pattern CP6 may include the narrow patterns P1 extending in one direction. Some of the narrow patterns P1 may be connected to the first ground selection line GSL1. Some other of the narrow patterns P1 may be connected to the second ground selection line GSL2. As shown in FIG. 12, since none of the narrow patterns P1 is connected to both the first ground selection line GSL1 and the second ground selection line GSL2, the first ground selection line GSL1 and the second ground selection line GSL2 may be electrically insulated from each other.

Also, the cut pattern insulator P2 may extend in a zig-zag shape along the narrow patterns P1.

Figure 13:
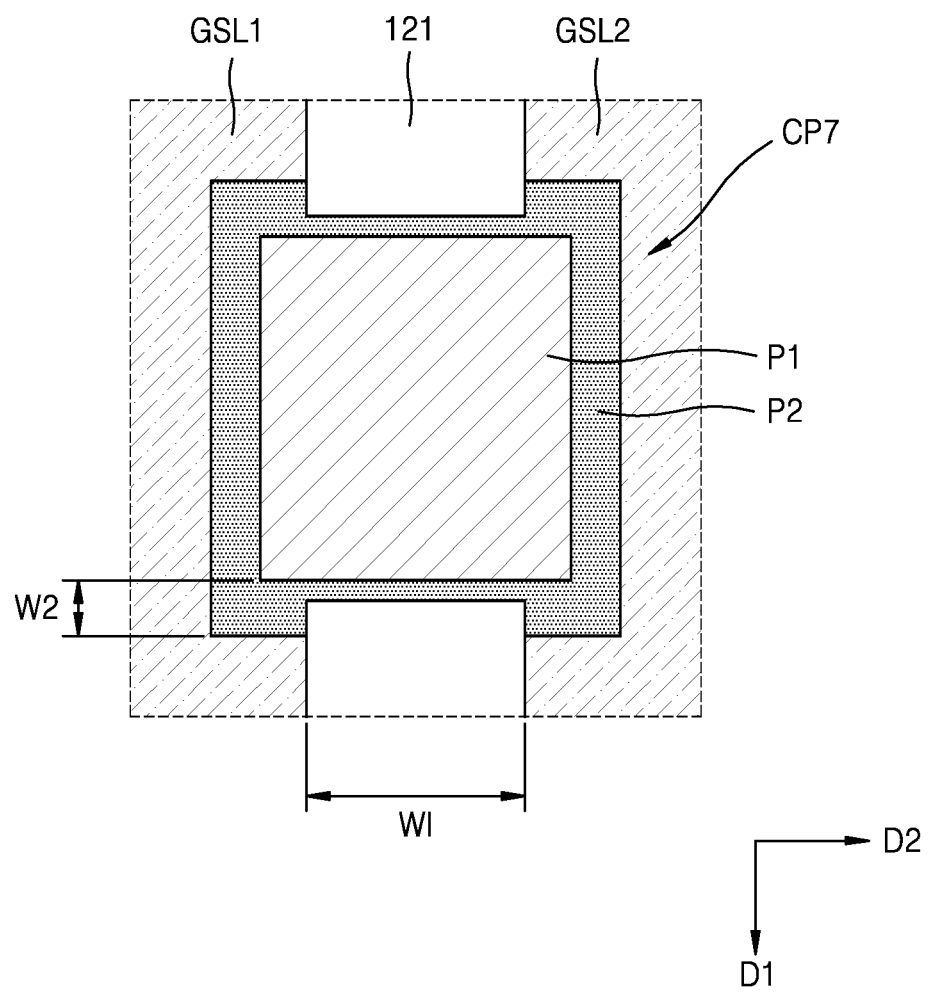

FIG. 13 is a plan view of a cut pattern CP7 according to an embodiment.

Referring to FIG. 13, there may be only one narrow pattern P1 in the cut pattern CP7. The narrow pattern P1 may be surrounded by the cut pattern insulator P2. The cut pattern insulator P2 may extend along a closed perimeter of the cut pattern CP7. For example, the narrow pattern P1 may have a continuously formed pattern, e.g., a square pattern or a rectangular pattern, and the cut pattern insulator P2 may surround the narrow pattern P1, e.g., in a plan view.

In FIG. 13, an example in which the isolation region 121 does not meet the narrow pattern P1 is shown, but in certain embodiments, the isolation region 121 may farther extend to meet the narrow pattern P1.

Figure 14:
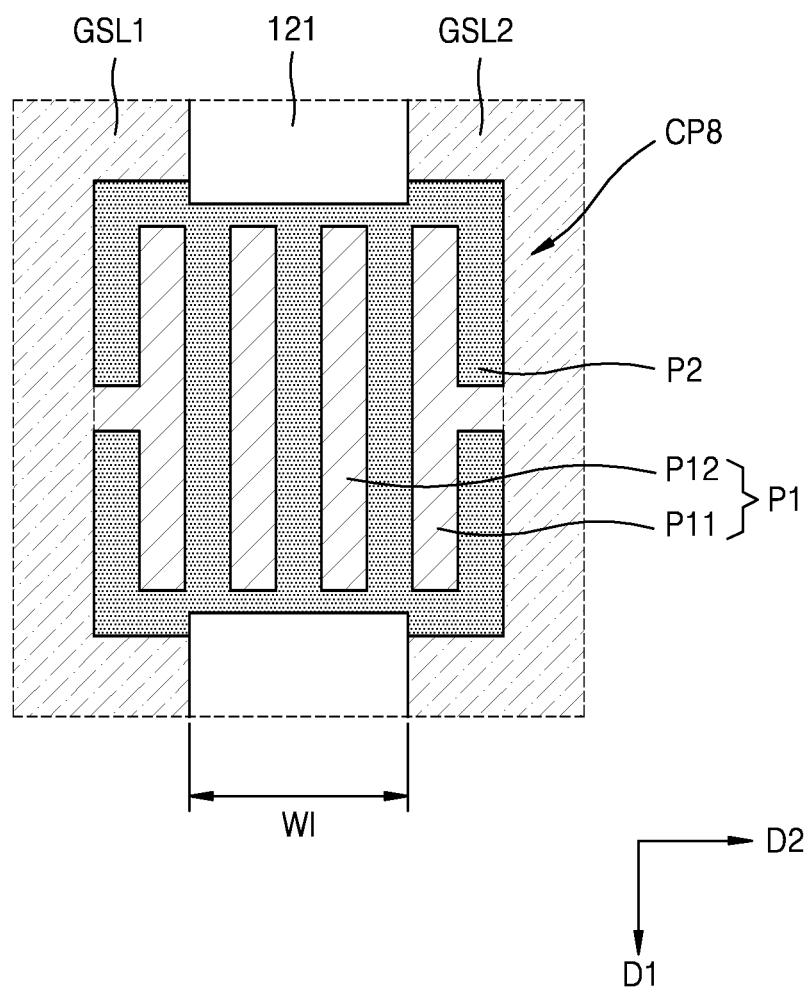

FIG. 14 is a plan view of a cut pattern CP8 according to an embodiment.

Referring to FIG. 14, the cut pattern CP8 may denote a portion indicated by dashed lines. The narrow pattern P1 may include first narrow patterns P11 respectively connected to the first ground selection line GSL1 and the second ground selection line GSL2, and second narrow patterns P12 that are not connected to the first and second ground selection lines GSL1 and GSL2.

The first narrow patterns P11 and the second narrow patterns P12 may respectively extend in one direction (here, the direction D1) in parallel with each other. The second narrow patterns P12 may be surrounded by the cut pattern insulator P2, e.g., in a plan view. The first narrow patterns P11 may be surrounded, e.g., in a plan view, by the cut pattern insulator P2, except for portions connected to the first and second ground selection lines GSL1 and GSL2.

The semiconductor memory device and the semiconductor device may maintain a high operation speed with high reliability and may be manufactured at reduced cost.

FIGS. 15A to 15J are cross-sectional views for describing a method of manufacturing a semiconductor memory device in order, according to an embodiment. In FIGS. 15A to 15J, cross-sections A-A' and B-B' are taken along lines A-A' and B-B' of FIG. 5, respectively.

Figure 15A:
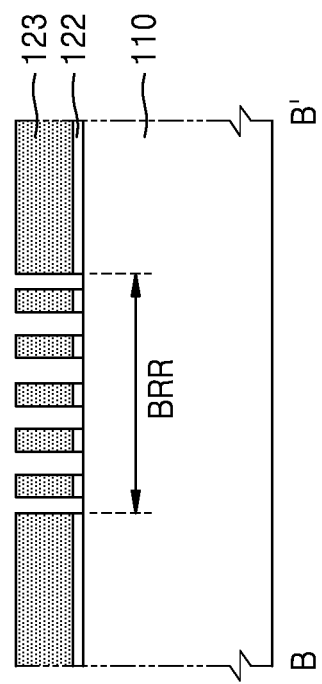
Figure 15A:
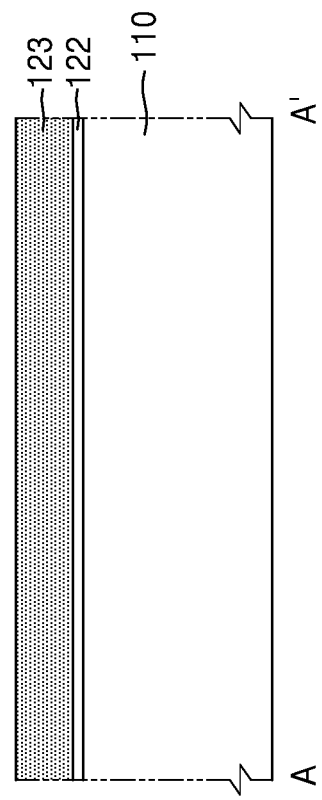

Referring to FIG. 15A, a substrate 110 is provided. The substrate 110 may include Si, Ge, or SiGe. In some embodiments, the substrate 110 may include a silicon-on-insulator (SOI) substrate or a germanium-on-insulator (GeOI) substrate. The substrate 110 may be of a first conductive type, for example, of a P type.

A buffer dielectric film 122 may be provided on the substrate 110. The buffer dielectric film 122 may include, for example, a silicon oxide film. The buffer dielectric film 122 may be formed by, for example, a thermal oxidation process. In some embodiments, the buffer dielectric film 122 may include a middle temperature oxide (MTO).

A sacrificial layer 123, which may be used later to form a ground selection line GSL, may be provided on the buffer dielectric film 122. The sacrificial layer 123 may include a material having different wet-etching characteristics than the buffer dielectric film 122 and an insulating layer 124 formed on the sacrificial layer 123 (see FIG. 15B, which will be described later). The sacrificial layer 123 may include, for example, a silicon nitride layer, a silicon oxynitride layer, a polysilicon layer, or a polysilicon germanium layer. The sacrificial layer 123 may be formed by, for example, a CVD method.

The sacrificial layer 123 and the buffer dielectric film 122 may be at least partially removed from a bridge region BRR. For example, the bridge region BRR may be a region in which a bridge pattern or bridge patterns are formed. For example, the bridge region BRR may include a portion of substrate 110 on which the bridge pattern(s) are formed. In some embodiments, the buffer dielectric film 122 and the sacrificial layer 123 may be partially removed from the bridge region BRR to pattern narrow patterns P1 of a desired shape. A photolithography process may be used to selectively pattern the buffer dielectric film 122 and the sacrificial layer 123 in the bridge region BRR.

The narrow patterns P1 provided in the bridge region BRR may be any one of the narrow patterns P1 shown in FIGS. 7A to 14.

Figure 15B:
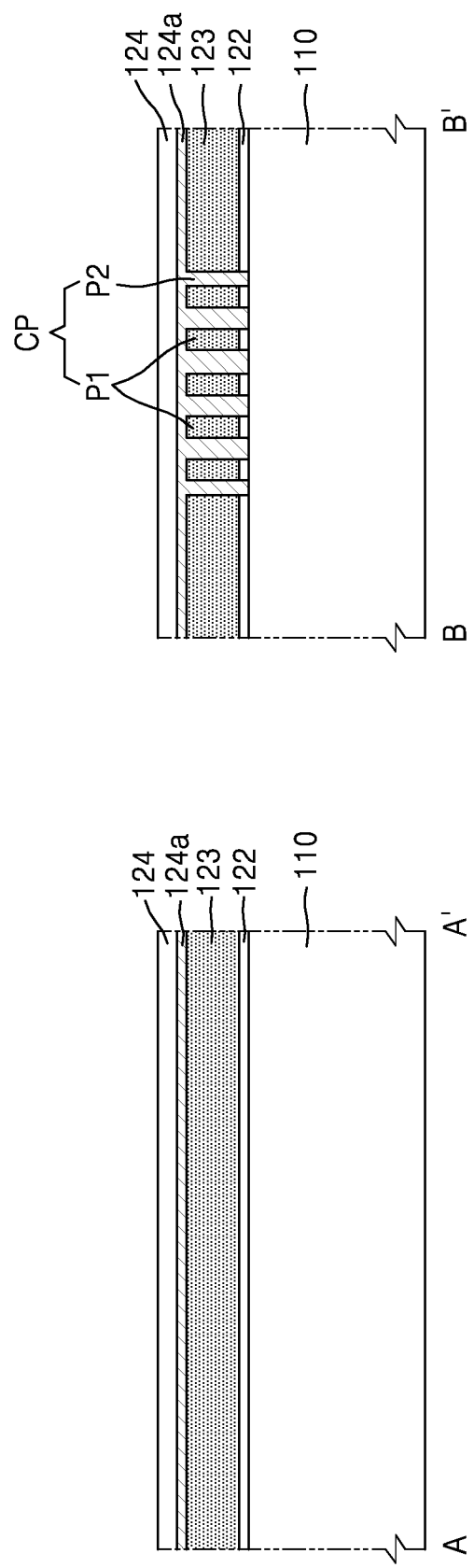

Referring to FIG. 15B, the cut pattern insulator P2 may be formed in the space between the narrow patterns P1. The cut pattern insulator P2 may be formed by an ALD process. As well known in the art, since the ALD process has superior step coverage to other deposition methods, the cut pattern insulator P2 may be formed with excellent conformity.

As described above with reference to FIGS. 7A to 14, the horizontal dimension of an empty space between the narrow patterns P1 may be relatively small in at least one direction, and thus the space may be rapidly filled by the ALD process. Also, the cut pattern insulator P2 may be formed with excellent conformity, and thus may cover an upper surface of the sacrificial layer 123, as well as upper surfaces of the narrow patterns P1, to obtain the first insulating layer 124a. The first insulating layer 124a may have a substantially flat upper surface. The first insulating layer 124a may have a substantially flat upper surface because the cut pattern insulator P2 and the first insulating layer 124a are formed with high conformity by the ALD process.

The insulating layer 124 may be formed on the first insulating layer 124a. The insulating layer 124 may be formed by a method other than the ALD process. For example, the cut pattern insulator P2 and the first insulating layer 124a may include silicon oxide layers formed by the ALD process, and the insulating layer 124 may include, but is not limited to, a tetraethyl orthosilicate (TEOS) oxide using TEOS as a silicon source, a high density plasma (HDP) oxide formed by using silane as a silicon source and using the HDP, etc.

In some embodiments, there may be an interface between the first insulating layer 124a and the insulating layer 124.

Figure 15C:
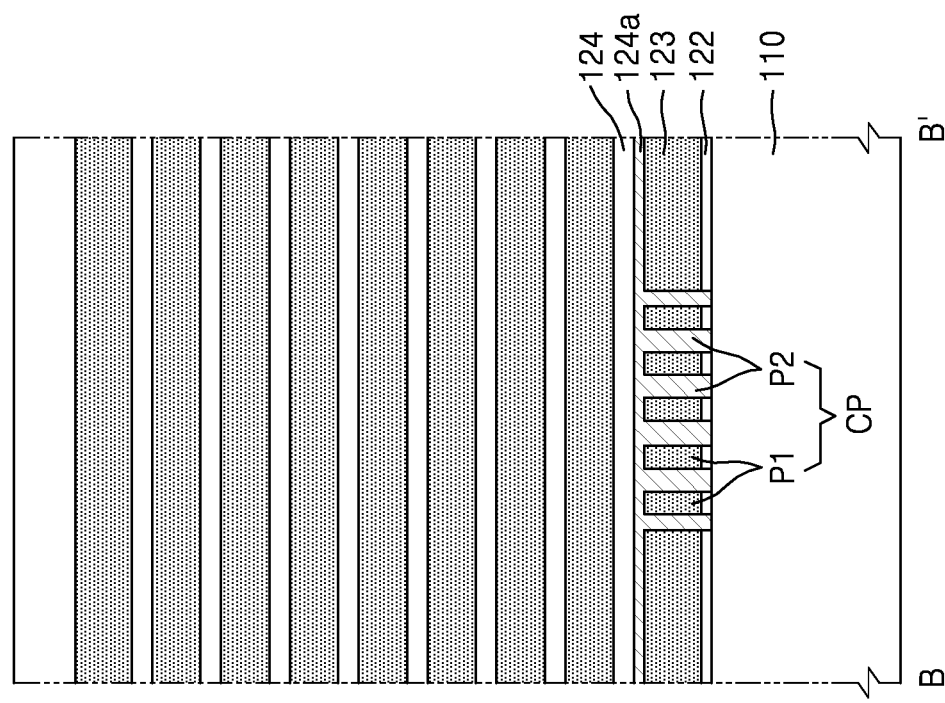
Figure 15C:
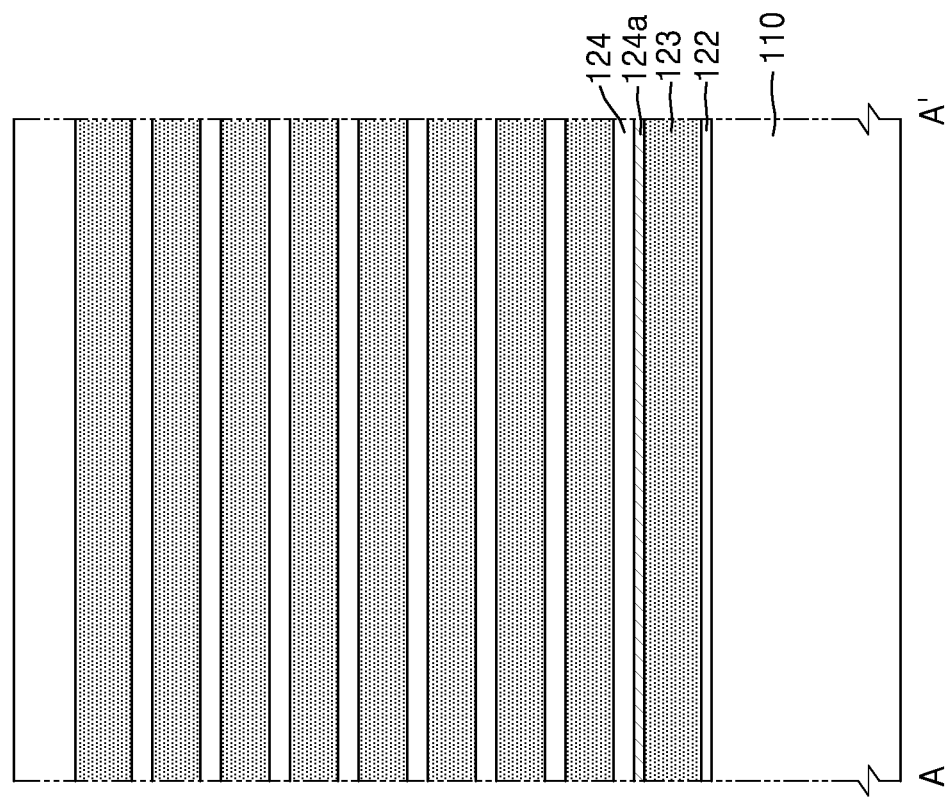

Referring to FIG. 15C, sacrificial layers 123 and insulating layers 124 are alternately stacked. A thickness of an uppermost insulating layer 124 may be greater than those of other insulating layers 124. The insulating layers 124 may include, for example, a TEOS oxide or HDP oxide layer. The sacrificial layers 123 may include a material having different wet-etching characteristics, e.g., etching selectivity, than the buffer dielectric film 122 and the insulating layers 124. The sacrificial layers 123 may include, for example, a silicon nitride layer, a silicon oxynitride layer, a polysilicon layer, or a polysilicon germanium layer. The sacrificial layers 123 and the insulating layers 124 may be formed by, for example, a CVD method.

Figure 16:
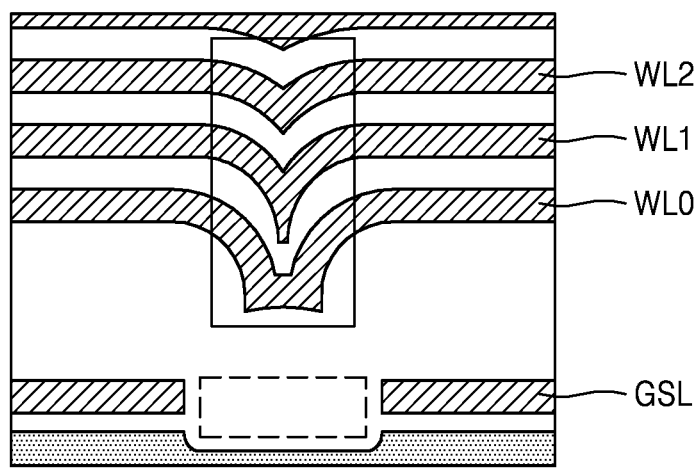
FIG. 16 is a cross-sectional view of a bridge when ground selection lines and word lines are arranged without using a cut pattern.

When the sacrificial layers 123 and the insulating layers 124 are stacked without forming the cut pattern CP in the bridge region BRR (e.g., below the bridges BG), dented portions (e.g., in the bridges BG as shown in FIG. 16) may be accumulated, which may cause product failure such as breakdown, because an electric field may concentrate on an upper portion of the bridge region BRR in horizontal electrodes that will be formed later.

FIG. 16 shows a cross-section of a bridge region including bridges BG connecting word lines when the ground selection line GSL and the word lines WL0, WL1, and WL2 are formed without forming the cut pattern CP.

Referring to FIG. 16, in a region (denoted by a dashed rectangle) where the ground selection line GSL is disconnected, the word lines WL0, WL1, and WL2 stacked on the region and insulators therebetween may have a dented cross-sectional shape. In such a semiconductor device, an electric field may concentrate on the dented portion (denoted by a solid-line rectangle) during operation, and thus failure such as a breakdown may occur.

Figure 15D:
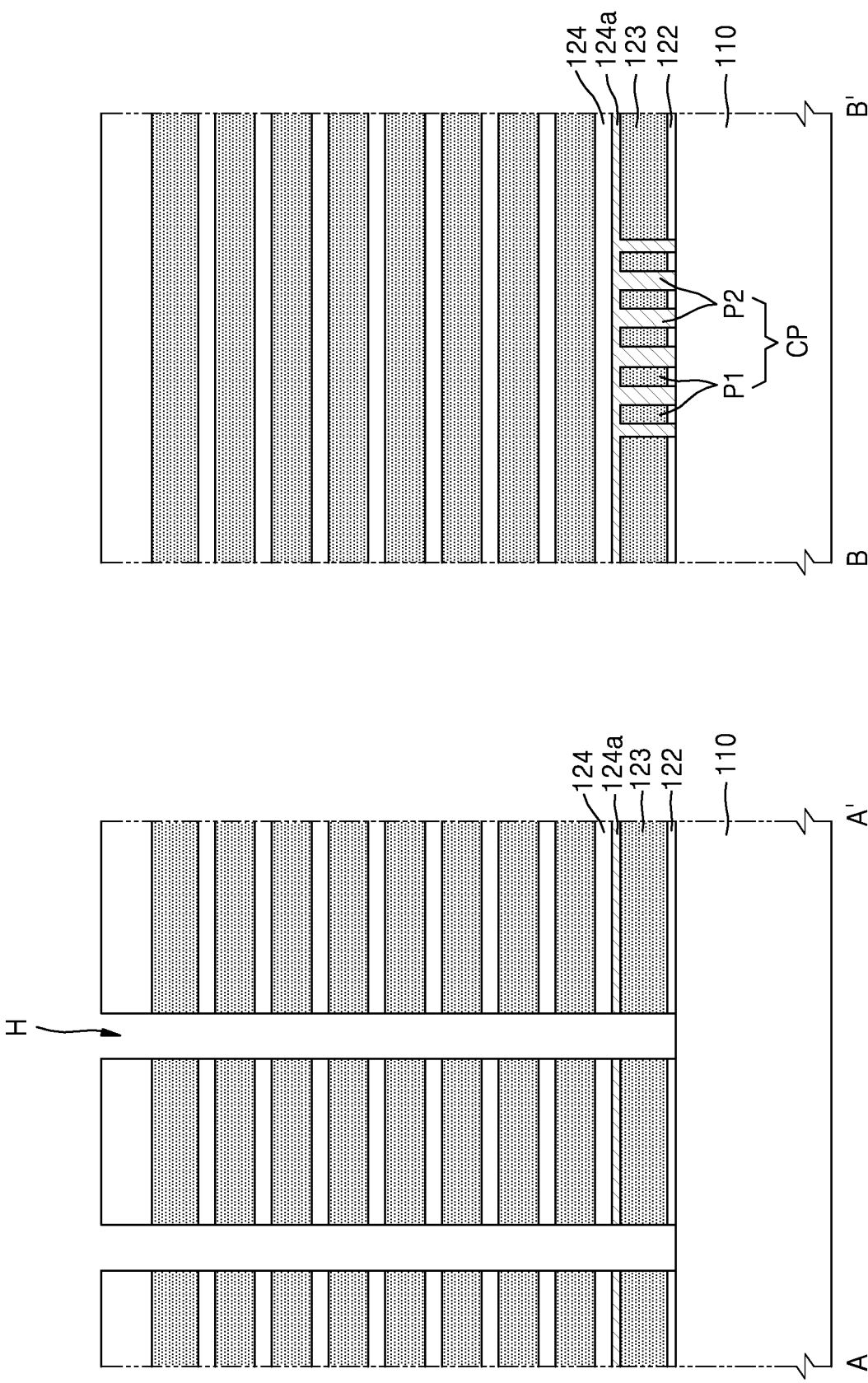

Referring to FIG. 15D, cell holes H are formed to penetrate through the buffer dielectric film 122, the sacrificial layers 123, and the insulating layers 124 to expose the substrate 110. The cell holes H may be formed by, for example, a photolithography process.

Figure 15E:
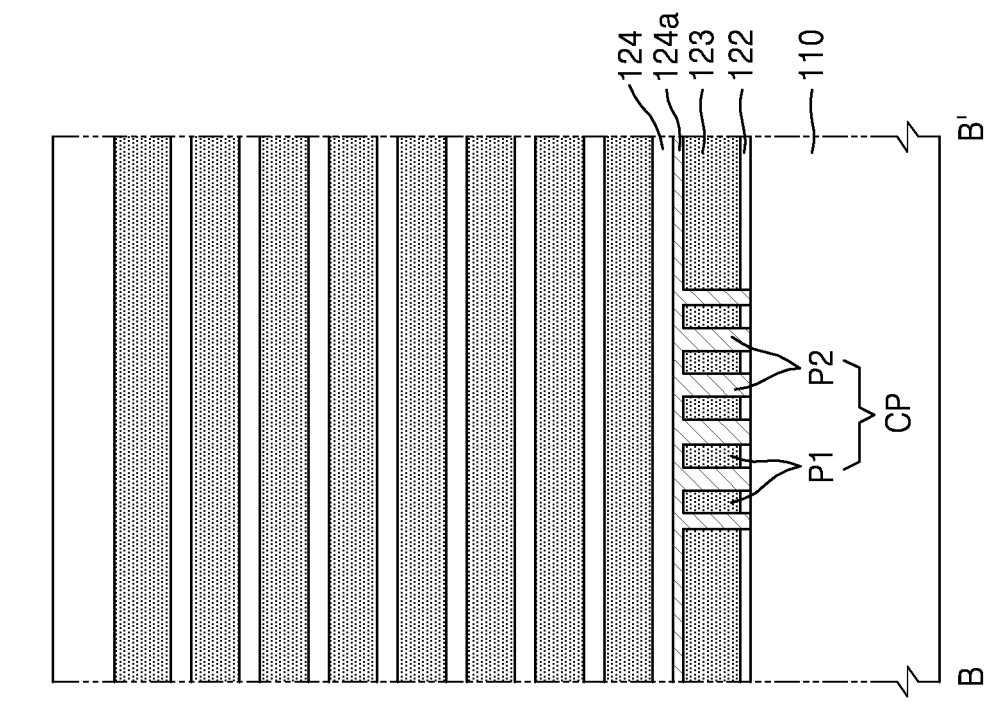
Figure 15E:
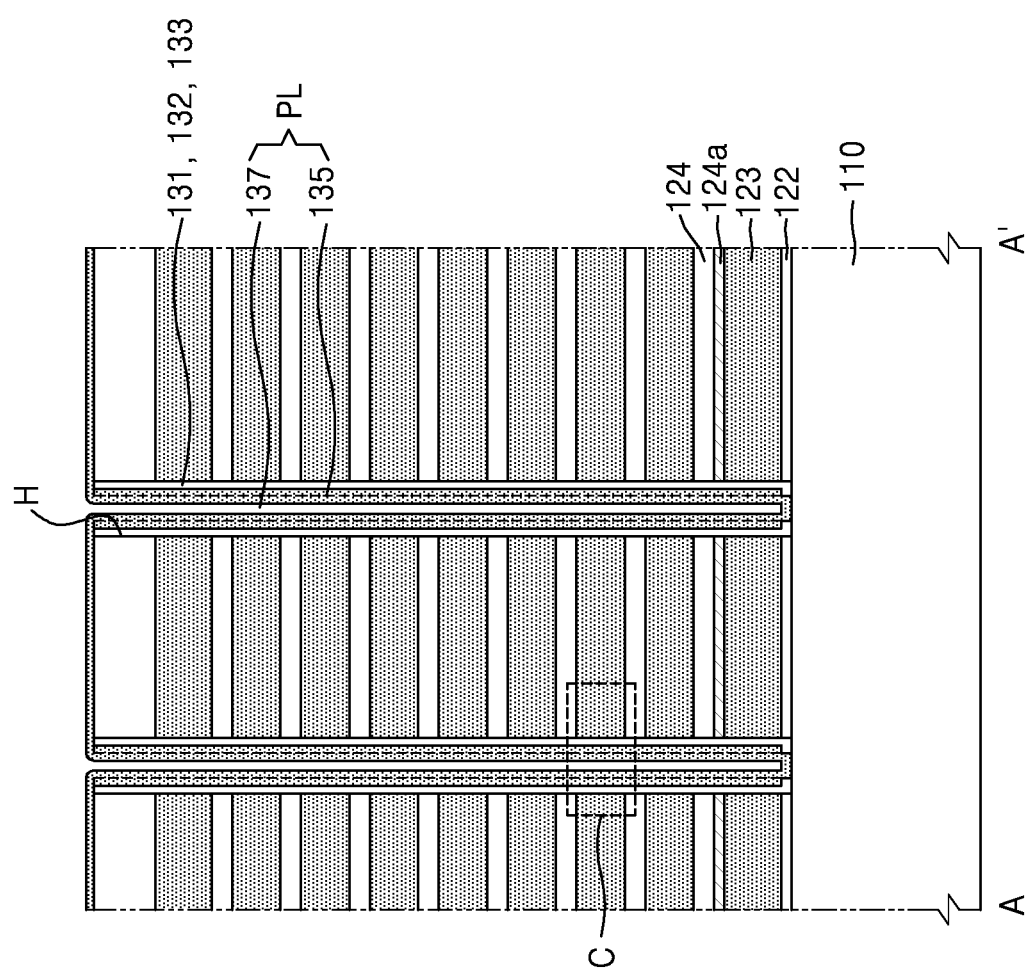

Referring to FIGS. 15E and 15F, cell columns PL may be formed in the cell holes H. A process of forming the cell columns PL will be described below in more detail with reference to FIGS. 17A and 17B, which are enlarged views of regions C in FIGS. 15E and 15F, respectively.

Figure 17A:
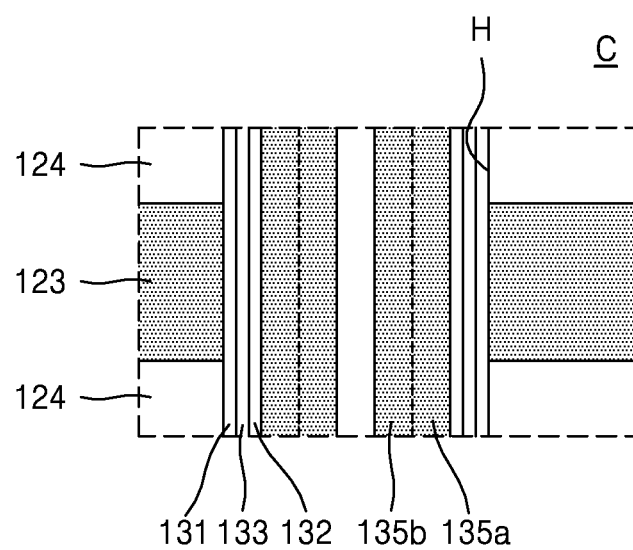
FIG. 17A is an enlarged view showing a region C of FIG. 15E in detail.

Referring to FIGS. 15E and 17A, a protective layer 131 may be formed on a sidewall of each of the cell holes H. The protective layer 131 may include a silicon oxide layer. A charge storage layer 133 is provided on the protective layer 131. The charge storage layer 133 may include a charge trap layer or an insulating layer including conductive nanoparticles. The charge trap layer may include, for example, a silicon nitride layer. A tunnel insulating layer 132 is provided on the charge storage layer 133. The tunnel insulating layer 132 may include a silicon oxide layer. The protective layer 131, the tunnel insulating layer 132, and the charge storage layer 133 may be formed by an ALD or a CVD method.

A first sub-semiconductor layer 135a may be provided on the tunnel insulating layer 132. The first sub-semiconductor layer 135a may be anisotropically etched to expose the substrate 110. The first sub-semiconductor layer 135a may remain as a spacer layer on the sidewall of the tunnel insulating layer 132. A second sub-semiconductor layer 135b may be provided on the first sub-semiconductor layer 135a. The second sub-semiconductor layer 135b contacts the substrate 110. The first and second sub-semiconductor layers 135a and 135b may be formed by an ALD or CVD method. The first and second sub-semiconductor layers 135a and 135b may include amorphous silicon layers.

Figure 17B:
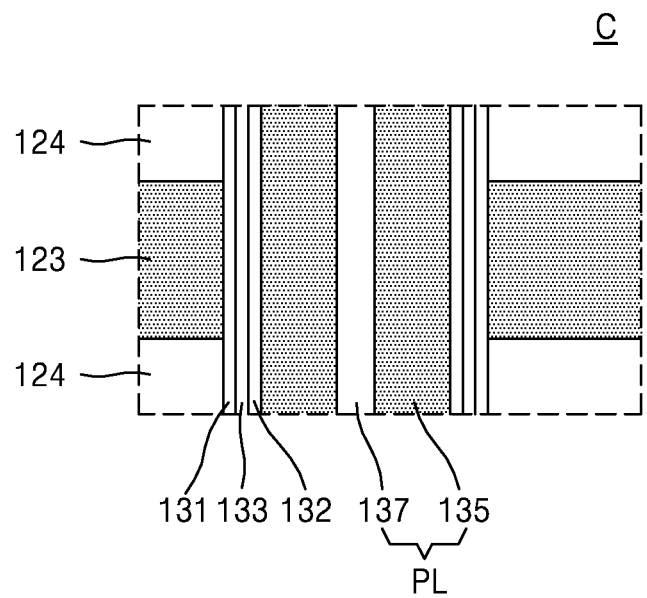
FIG. 17B is an enlarged view showing a region C of FIG. 15F in detail.

Referring to FIGS. 15F and 17B, a thermal treatment process is performed, and the first and second sub-semiconductor layers 135a and 135b may be changed into a semiconductor layer 135. The semiconductor layer 135 may include a polysilicon layer or a crystalline silicon layer.

The semiconductor layer 135 does not completely fill the cell holes H, but an insulating material may be provided on the semiconductor layer 135 to completely fill the cell holes H. The semiconductor layer 135 and the insulating material may be planarized to expose an uppermost insulating layer 124. Accordingly, cylindrical cell columns PL filled with a filling insulating layer 137 may be formed. The semiconductor columns PL may include semiconductor layers of a first conductive type. Unlike FIGS. 15F and 17B, the semiconductor layer may be formed to fully fill the cell holes H in certain embodiments. In this case, there is no need to form the filling insulating layer 137.

Upper portions of the cell columns PL may be recessed to be lower than the uppermost insulating layer 124. A conductive pattern 136 may be formed in the recessed upper portion of each of the cell columns PL in the cell holes H. The conductive patterns 136 may include doped polysilicon or metal. Impurity ions of a second conductive type may be implanted into upper portions of the conductive pattern 136 and the cell columns PL to form drain regions D. The second conductive type may be, for example, an N-type.

Figure 15G:
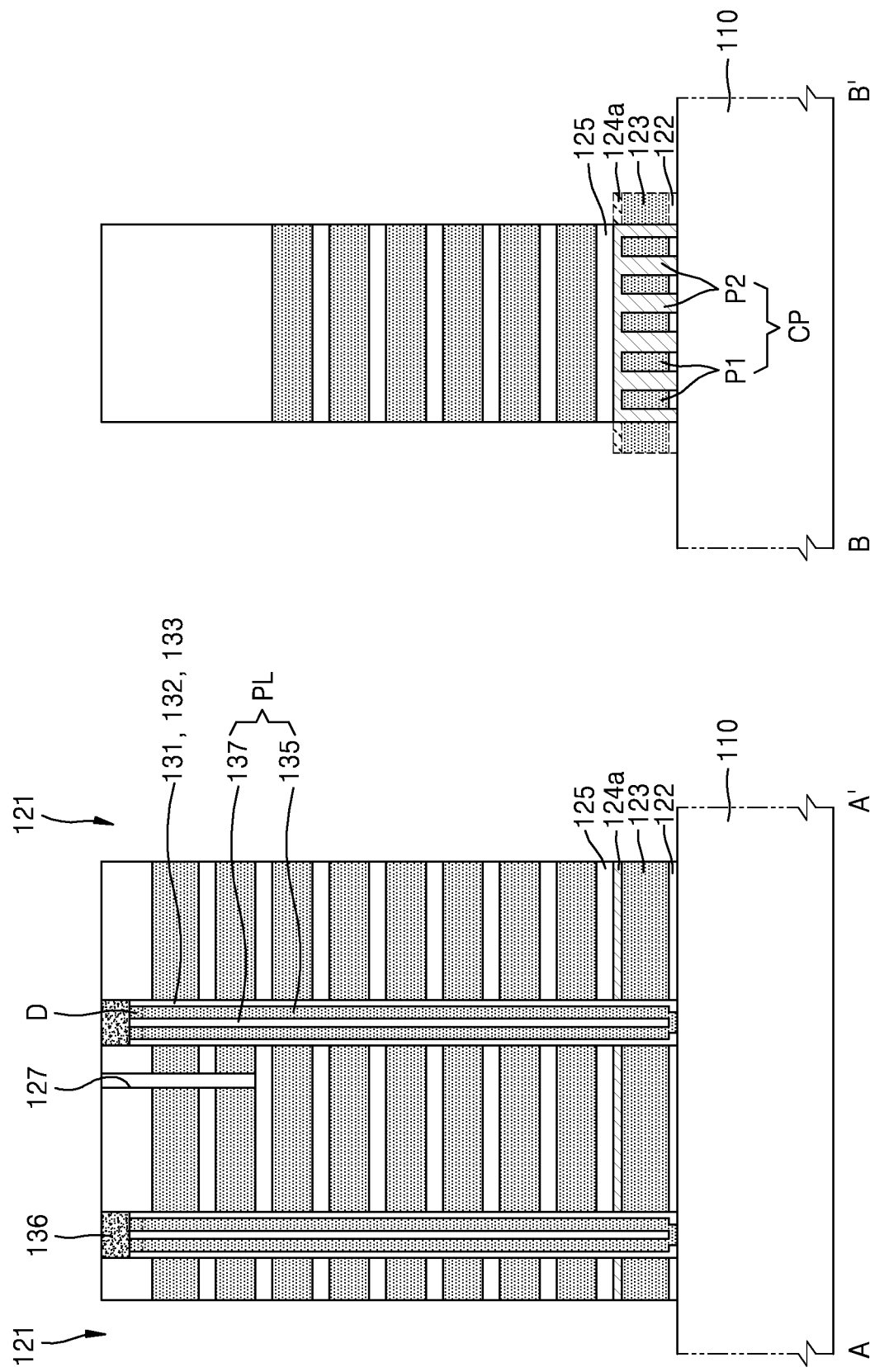

Referring to FIG. 15G, the buffer dielectric film 122, the sacrificial layers 123, and the insulating layers 124 may be continuously patterned to form isolation regions 121 that extend in a first direction D1 and are separated from one another to partially expose the substrate 110. As a result of the patterning, insulating patterns 125 may be formed from the insulating layers 124. Due to the patterning, an edge of the cut pattern CP may be partially removed. As a result, sacrificial layers 123 may be removed from regions where the ground selection lines GSL are to be formed.

Prior to the patterning, the uppermost insulating layer 124 and the sacrificial layer 123 between the isolation regions 121 may be patterned to form an opening 127. The opening 127 may extend between the isolation regions 121 in the first direction D1 to thereby divide the uppermost sacrificial layer 123 into two. The opening 127 may be filled with an insulating layer, for example, a silicon oxide layer.

Figure 15H:
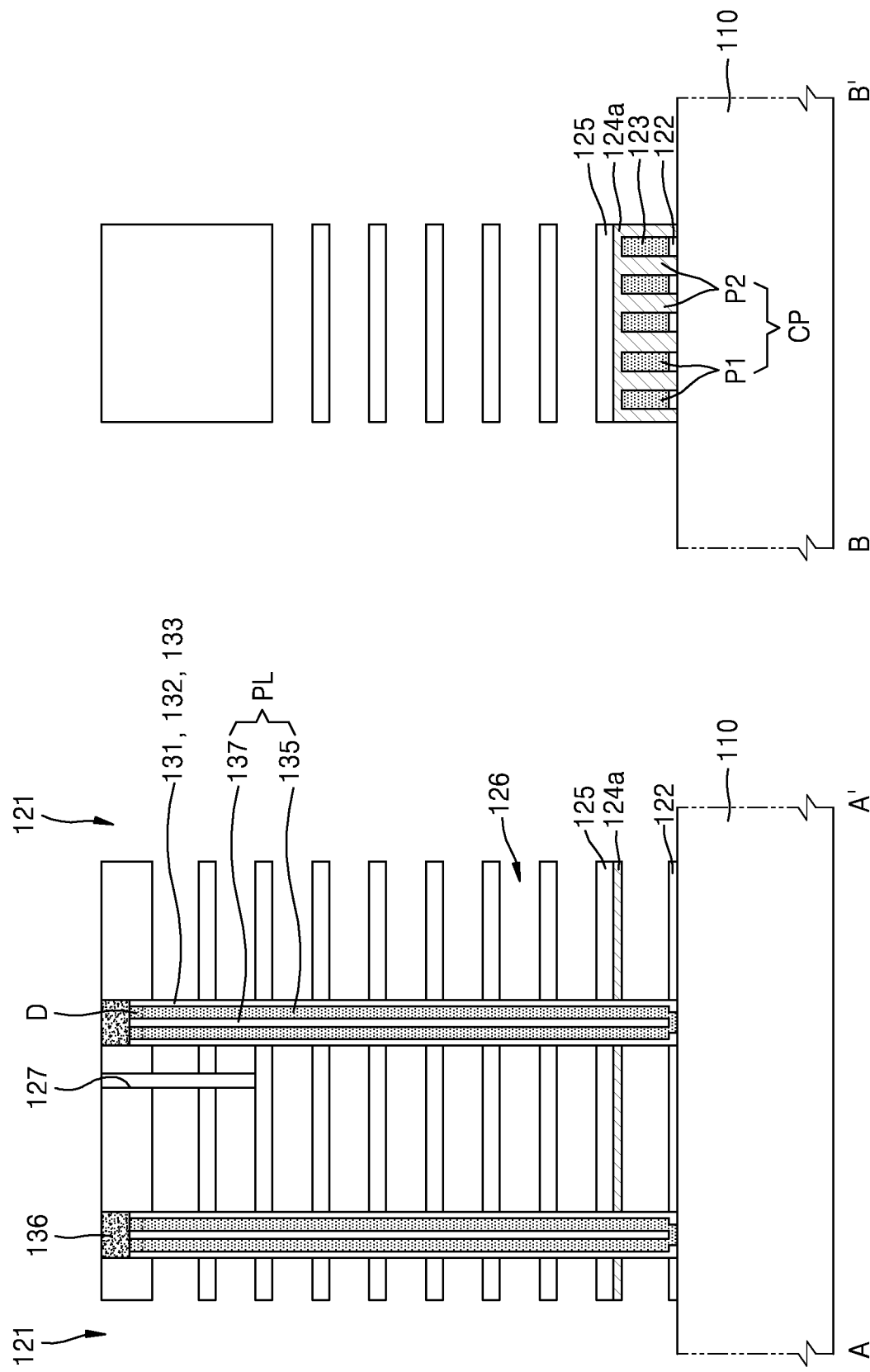

Referring to FIG. 15H, the sacrificial layers 123 exposed by the isolation regions 121 may be selectively removed to form recess regions 126. The recess regions 126, as regions from which the sacrificial layers 123 are removed, may be defined by the cell columns PL and the insulating patterns 125. When the sacrificial layers 123 include a silicon nitride layer or a silicon oxynitride layer, the sacrificial layers 123 may be removed using an etchant including phosphoric acid. A side wall of the cell columns PL may be partially exposed through the recess regions 126.

The protective layer 131 may prevent damage to the charge storage layer 133 caused by an etchant used to remove the sacrificial layers 123. Portions of the protective layer 131 exposed by the recess regions 126 may be selectively removed. When the protective layer 131 includes a silicon oxide layer, the protective layer 131 may be removed by, for example, an etchant including fluoric acid. For example, a portion of the charge storage layer 133 may be exposed through the recess regions 126.

To make formation of the cell holes H easier, a total height of the stack of the sacrificial layers 123 and the insulating layers 124 may be reduced. Accordingly, the cell holes H may have a reduced aspect ratio, which may facilitate etching the stack of the sacrificial layers 123 and the insulating layers 124. When the number of stacked layers is the same, the total height of the stack may be reduced by reducing the thickness of each of the sacrificial layers 123 and/or the thickness of each of the insulating layers 124.

Referring to FIG. 15I, a blocking dielectric layer 134 may be formed in the recess regions 126. The blocking dielectric layer 134 may be conformally formed on upper and lower surfaces of the insulating patterns 125 and on the charge storage layer 133 exposed in the recess regions 126. The blocking dielectric layer 134 may include a high-k dielectric layer, for example, an aluminum oxide layer or a hafnium oxide layer. The blocking dielectric layer 134 may have a multilayer structure including a plurality of thin layers. For example, the blocking dielectric layer 134 may include an aluminum oxide layer and a silicon oxide layer, wherein the aluminum oxide layer and the silicon oxide layer may be stacked in any of a variety of stacking orders. The blocking dielectric layer 134 may be formed by ALD and/or CVD with a good step coverage.

Subsequently, a conductive layer 140 may be formed on the blocking dielectric layer 134. The conductive layer 140 may include at least one of a doped silicon layer, a metal layer, a metal nitride layer, and a metal silicide layer. The conductive layer 140 may be formed by CVD or ALD. For example, the conductive layer 140 may include a barrier layer, and a metal layer on the barrier layer. The barrier layer may be a metal nitride layer, for example, a titanium nitride layer. The metal layer may be, for example, a tungsten layer. As another example, the conductive layer 140 may include a polysilicon layer, and a silicide layer on the polysilicon layer. In this case, the conductive layer 140 may be formed by forming a polysilicon layer, removing portions of the polysilicon layer adjacent to the isolation region 121 to form recesses in the polysilicon layer, forming a metal layer on the polysilicon layer having the recesses, thermally treating the metal layer to form a silicide layer, and removing an unreacted portion of the metal layer. The metal layer used to form the silicide layer may include tungsten, titanium, cobalt, or nickel.

Figure 17C:
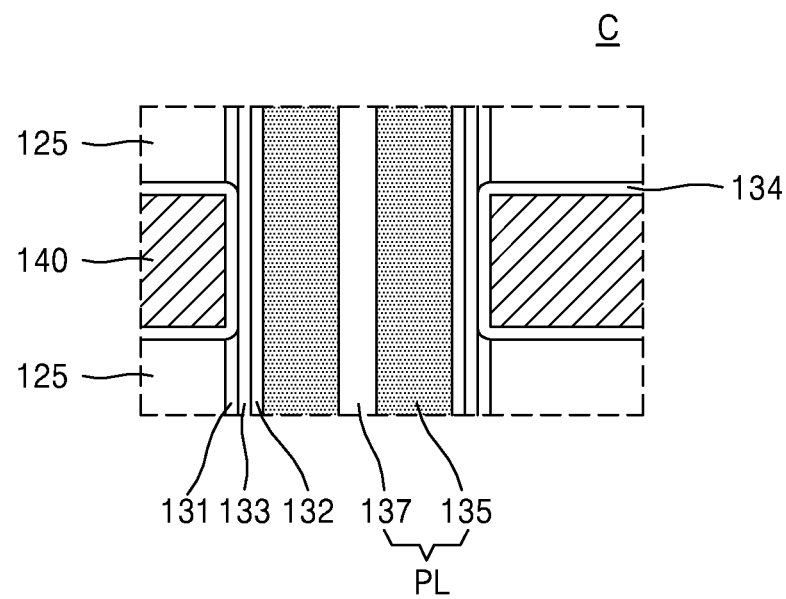
FIG. 17C is an enlarged view showing a region C of FIG. 15I in detail.

FIG. 17C is an enlarged view of part C of FIG. 15I in detail.

Referring to FIG. 17C, only the blocking dielectric layer 134 may be formed in the recess regions 126, whereas the tunnel insulating layer 132 and the charge storage layer 133 may be formed in the cell holes H.

In some embodiments, all the tunnel insulating layer 132, the charge storage layer 133, and the blocking dielectric layer 134, which may constitute the data storage element 130, may be formed in the recess regions 126 (see FIG. 15H). In this case, the protective layer 131 may not be formed. For example, in the processes of FIGS. 15E and 15F, the cell columns PL may be formed without forming the protective layer 131, the charge storage layer 133, and the tunnel insulating layer 132 in the cell holes H. The cell columns PL may be formed by depositing a semiconductor layer 135 in the cell holes H. In some embodiments, the filling insulating layer 137 may be formed at the center of the semiconductor layer 135 similarly to the ones shown in FIGS. 15F and 15G. Then, in the process of FIG. 15I, the tunnel insulating layer 132, the charge storage layer 133, and the blocking dielectric layer 134 may be sequentially formed in the recess regions 126. Next, the conductive layer 140 may be formed on the blocking dielectric layer 134.

In some embodiments, the charge storage layer 133 and the blocking dielectric layer 134 may be formed in the recess regions 126. In the processes of FIGS. 15E and 15F, after the protective layer 131 and the tunnel insulating layer 132 are formed in the cell holes H, the cell columns PL may be formed. The cell columns PL may be formed in a similar manner as in the processes of FIGS. 15E and 15F. Then, in the process of FIG. 15I, the charge storage layer 133 and the blocking dielectric layer 134 may be sequentially formed in the recess regions 126. Next, the conductive layer 140 may be formed on the blocking dielectric layer 134.

In some embodiments, all the tunnel insulating layer 132, the charge storage layer 133, and the blocking dielectric layer 134, which may constitute the data storage element 130, may be formed in the cell holes H. In the processes of FIGS. 15E and 15F, the protective layer 131, the blocking dielectric layer 134, the charge storage layer 133, and the tunnel insulating layer 132 may be sequentially formed in the cell holes H. The cell columns PL may be formed on the tunnel insulating layer 132. The cell columns PL may be formed in a similar manner as in the processes of FIGS. 15E and 15F. Next, in the process of FIG. 15I, the conductive layer 140 may be formed in the recess regions 126.

In some embodiments, the data storage element 130 may be a variable resistance pattern. The variable resistance pattern may include at least one of materials having variable resistance characteristics.

For example, the data storage element 130 may include a material (for example, a phase change material) having an electrical resistance that may be changed by heat generated by an electric current that passes through an adjacent electrode. The phase change material may include at least one of antimony (Sb), tellurium (Te), and selenium (Se). For example, the phase change material may include about 20 Atom % to about 80 Atom % of tellurium (Te), about 5 Atom % to about 50 Atom % of antimony (Sb), and the balance of germanium (Ge) as a chalcogen compound. The phase change material may further include at least one of N, O, C, Bi, In, B, Sn, Si, Ti, Al, Ni, Fe, Dy, and La as impurities. Alternatively, the variable resistance pattern may be formed of one of GeBiTe, InSb, GeSb, and GaSb.

In some embodiments, the data storage element 130 may have a thin-film structure having a variable electrical resistance that may be changed due to spin transfer by an electric field that passes through the thin-film structure. The data storage element 130 may have a thin-film structure having magnetoresistance characteristics, and may include, for example, at least one ferromagnetic material and/or at least one antiferromagnetic material.

As another example, the data storage element 130 may include at least one of a perovskite compound and/or a transition metal oxide. For example, the data storage element 130 may include at least one of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, and barium-strontium-zirconium oxide.

In these embodiments, the cell columns PL may be conductive columns. For example, the cell columns PL may include a conductive material. The conductive material may include, for example, at least one of a doped semiconductor, a metal, a conductive metal nitride, a silicide, and a nano structure such as carbon nanotubes or graphene.

To implement this structures, in the processes of FIGS. 15E and 15F, the protective layer 131 and the data storage element 130 may be sequentially formed in the cell holes H. The cell columns PL may be formed on the data storage element 130. The cell columns PL may be formed by depositing a conductive material. Next, in the process of FIG. 15I, the conductive layer 140 may be formed in the recess regions 126.

Subsequently, referring to FIG. 15J, a portion of the conductive layer 140 formed outside the recess regions 26 may be removed. Accordingly, horizontal electrodes are formed in the recess regions 126. The horizontal electrodes may include the ground selection line GSL, the word lines WL0 to WL3, the dummy word lines DM1 and DM2, and the string selection lines SSL1 and SSL2. For example, portions of each of the string selection lines SSL1 and SSL2, dummy word lines DM1 and DM2, word lines WL0-WL3, and ground selection line GSL may be gate electrodes of corresponding transistors. The upper string selection lines SSL1 and SSL2 may extend in the first direction D1, and each of the string selection lines SSL1 and SSL2 may be divided into two in the second direction D2. For example, the opening 127 and the insulating layer formed in the opening 127 may divide each of the string selection lines SSL1 and SSL2 into two separated string selection lines corresponding to one word line stack. For example, one word line stack may include two string selection lines disposed at the same vertical level. For example, one word line stack may include four string selection lines formed in two layers, each of which includes two parallel string selection lines.

As the portion of the conductive layer 140 formed in the isolation regions 121 is removed, a corresponding region of the substrate 110 may be exposed. A high concentration of impurity ions may be provided into the exposed region of the substrate 110 to form the common source lines CSL.

Then, an isolation insulating layer 120 that fills the isolation regions 121 may be formed. The cell columns PL arranged in the second direction D2 may be connected in common to one upper wiring BL1 or BL2 (see FIG. 3).

FIG. 18 is a cross-sectional view illustrating a cell column of a semiconductor memory device according to an embodiment. In the embodiment of FIG. 18, a channel contact region 151 is further formed in a bottom portion of cell holes H, unlike the embodiment illustrated in FIG. 3. In this embodiment, the differences from the embodiment of FIG. 3 will be mainly described, and the same structure with the embodiment of FIG. 3 may be omitted in the below description.

Referring to FIG. 18, after the cell holes H are formed as illustrated in FIG. 15D, a channel contact region 151 may be formed on a region of the substrate 110 that is exposed through a bottom in each of the cell holes H. In some embodiments, the channel contact region 151 may be formed on the exposed region of the substrate 110 by selective epitaxial growth (SEG). An upper surface of the channel contact region 151 may be at a level higher than an upper surface of the lowermost sacrificial layer 123.

Then, p-type impurities may be implanted into the channel contact region 151 by an ion implantation process. For example, the p-type impurities may be aluminum (Al), boron (B), indium (In), or potassium (K). A concentration of the p-type impurities may be about 5E16 to 1E19 atoms/cm$^3$. In some other embodiments, the p-type impurities may be in-situ doped while growing the channel contact region 151 by SEG.

Subsequently, after the cell columns PL and the isolation regions 121 are formed as illustrated in FIGS. 15E to 15G, the sacrificial layers 123 may be removed as illustrated in FIG. 15H, and an auxiliary gate insulating layer 153 may be formed on a sidewall of the channel contact region 151 by a thermal oxidation process. The auxiliary gate insulating layer 153 may be a thermal oxidation layer formed by a thermal oxidation of a part of the channel contact region 151 grown by SEG. However, the thermal oxidation process for forming the auxiliary gate insulating layer 153 may be omitted.

Figure 15J:
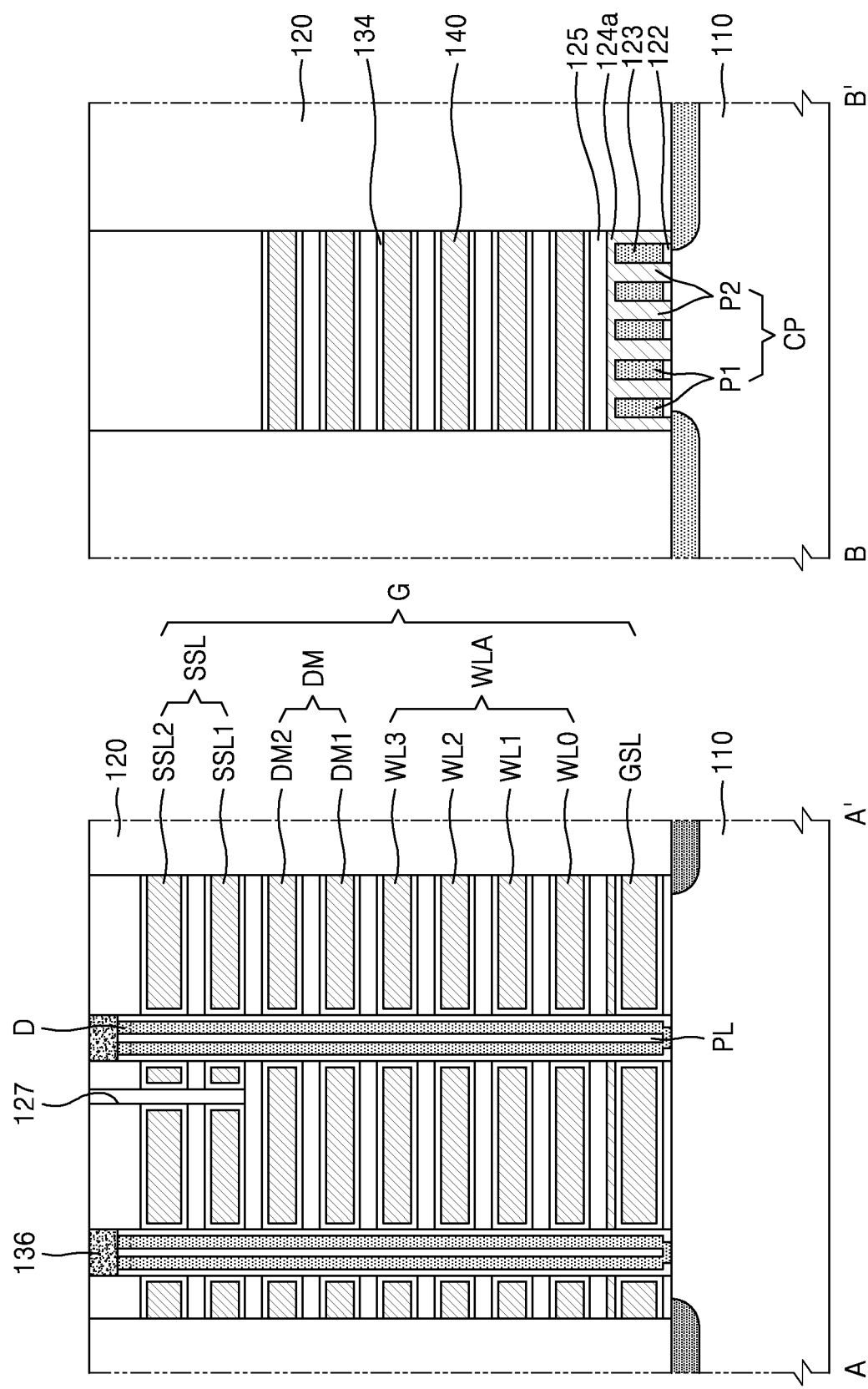

Subsequently, after the blocking dielectric layer 134, the tunnel insulating layer 132, the charge storage layer 133, and the conductive layer 140 are formed as illustrated in FIGS. 15I and 15J, an isolation insulating layer 120 that fills each of the isolation regions 121 may be formed. For example, the isolation insulating layer 120 may form an isolation pattern in the isolation regions 121.

Figure 19A:
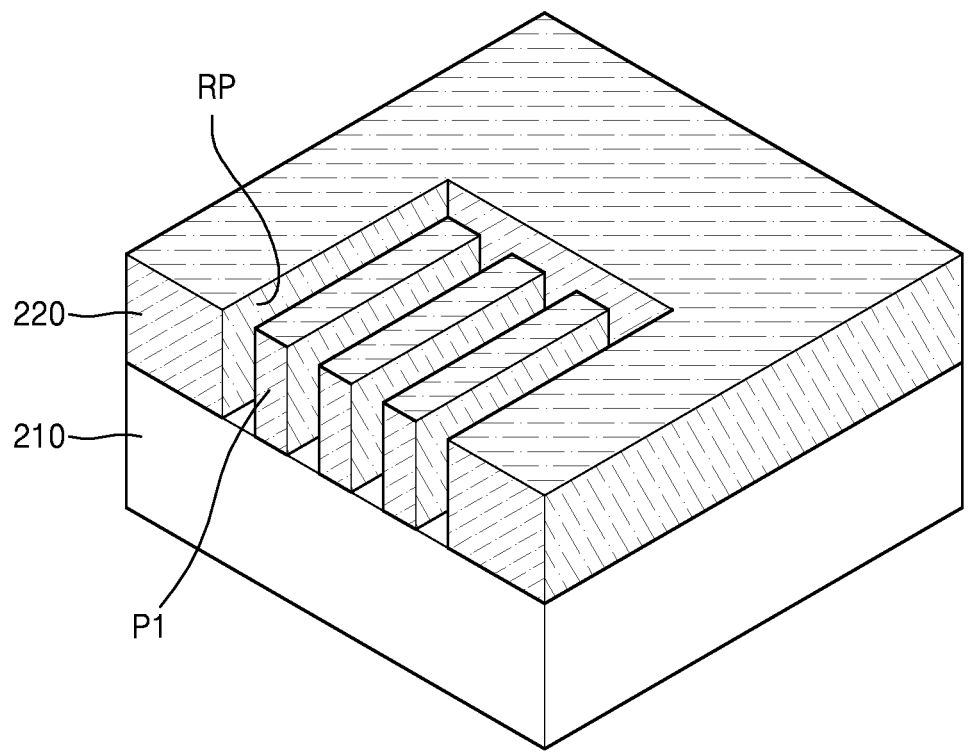
FIGS. 19A and 19B are perspective views for describing a method of forming an upper layer having a flat upper surface on an upper portion of a lower layer having a relatively large/deep recess pattern.
Figure 19B:
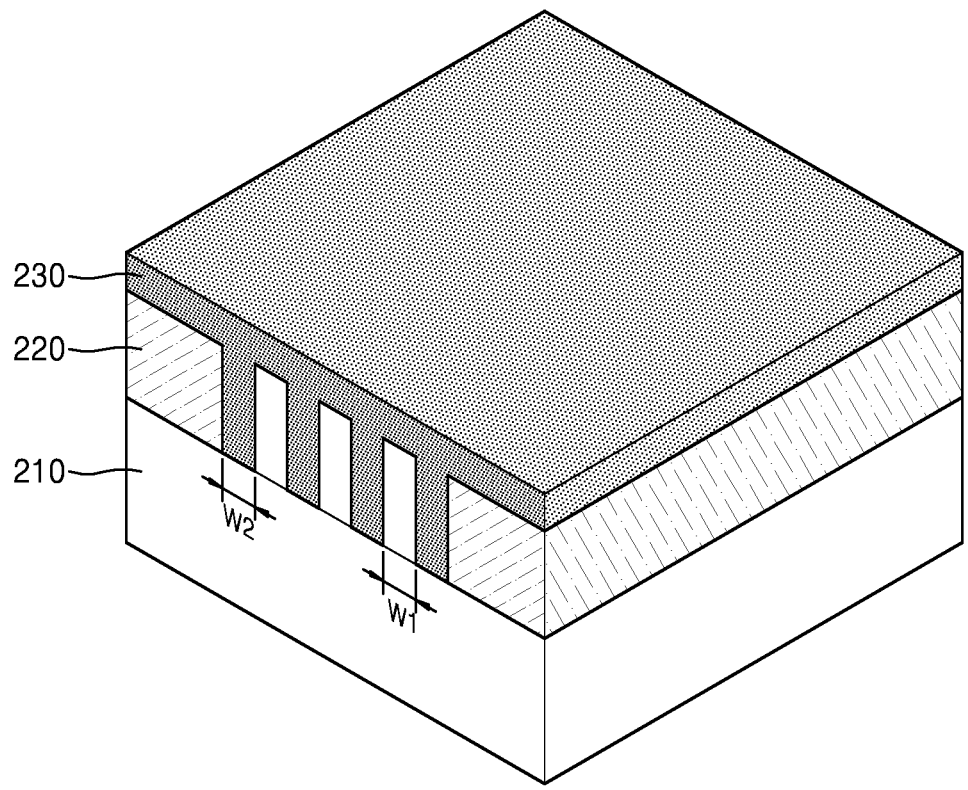

The above-described methods and structures may be applied when an arbitrary upper layer having a flat upper surface is formed on a lower layer having a relatively large/deep recess pattern. FIGS. 19A and 19B are perspective views for describing a method of forming an upper layer 230 having a flat upper surface on an upper portion of a lower layer 220 having a relatively large recess pattern.

Referring to FIG. 19A, the lower layer 220 may be provided on the substrate 110, and may include an arbitrary material. For example, the lower layer 220 may include a semiconductor material, a metal material, an insulating material, an inorganic material, etc. The lower layer 220 may include a recess pattern RP. The lower layer 220 may further include narrow patterns P1 having a fine width W1 in the recess pattern RP. In some embodiments, the narrow pattern P1 may include the same material as or a different material from that of the lower layer 220. The narrow patterns P1 may be arranged with sufficiently small intervals W2.

Referring to FIG. 19B, the upper layer 230 may be formed on the lower layer 220 by a method capable of forming a highly conformal layer, e.g., the ALD. As described above with reference to FIGS. 7A and 7B, when the interval between the narrow patterns P1 is sufficiently small, e.g., about 3 nm to about 100 nm, a space between two narrow patterns P1 may be rapidly filled by the upper layer 230 while the upper layer 230 is formed by the ALD. The upper layer 230 may have an even and flat upper surface due to the narrow patterns P1. For example, the narrow patterns P1 may help cause the upper layer 230 to have a flat upper surface compared to a case where the narrow patterns P1 are not formed in the recess pattern RP.

As described above, although the exemplary embodiments have been disclosed, one of ordinary skill in the art will appreciate that various modifications are possible, without departing from the scope and spirit of the inventive concept as disclosed in the accompanying claims. Therefore, all differences within the scope will be construed as being included in the inventive concept.

While the inventive concept has been particularly shown and described with reference to embodiments thereof, it will be understood that various changes in form and details may be made therein without departing from the spirit and scope of the following claims.

What is claimed is:

1. A semiconductor memory device comprising:
 a substrate including a cell region on which memory cells are disposed and a connection region on which conductive patterns are disposed, the conductive patterns electrically connected to the memory cells;
 a first word line stack comprising a plurality of first word lines that are stacked on the substrate in the cell region and extend to the connection region;
 a second word line stack comprising a plurality of second word lines that are stacked on the substrate in the cell region and extend to the connection region, the second word line stack being adjacent to the first word line stack;
 vertical channels disposed on the cell region of the substrate, the vertical channels being connected to the substrate and respectively coupled with the plurality of first and second word lines;
 a bridge connecting one of the plurality of first word lines in the first word line stack to a corresponding word line of the second word line stack; and
 a first pattern formed between a first ground selection line (GSL) and a second GSL,
 wherein the first pattern and the bridge overlaps in a plan view, and
 wherein the first pattern comprises a sub-pattern spaced apart from at least one of the two GSLs in a horizontal direction, the sub-pattern having a conductive material different from a material of the first and second GSLs.

2. The semiconductor memory device of claim 1, wherein the sub-pattern is spaced apart from both of the two GSLs in the horizontal direction.

3. The semiconductor memory device of claim 2, wherein side surfaces of the sub-pattern are surrounded by a first insulator.

4. The semiconductor memory device of claim 3, wherein the first insulator surrounding the side surfaces of the sub-pattern comprises a layer formed by an atomic layer deposition (ALD).

5. The semiconductor memory device of claim 3, wherein the first insulator extends along an outermost portion of the first pattern.

6. The semiconductor memory device of claim 3, wherein the first pattern comprises two or more sub-patterns extending in a same direction.

7. The semiconductor memory device of claim 3, wherein upper surfaces of the GSLs are at least partially coated by a material that is the same as the first insulator.

8. The semiconductor memory device of claim 1, wherein a width of the sub-pattern is narrower than a width of the GSLs.

9. The semiconductor memory device of claim 8, wherein side surfaces of the sub-pattern are surrounded by a first insulator, and
 wherein the first insulator has an upper surface that is substantially flat.

10. A semiconductor device comprising:
 a first and a second conductive patterns extending parallel to a first direction on a semiconductor substrate, the first conductive pattern having a first width and the second conductive pattern having a second width;
 a first pattern formed between the first and second conductive patterns in a plan view;
 a first insulating layer formed on the first and second conductive patterns; and
 a second insulating layer formed on the first insulating layer,
 wherein the first pattern comprises:
 a sub-pattern having a conductive material different from a material of the first and second conductive patterns; and
 a first insulator contacting side surfaces of the sub-pattern,
 wherein the sub-pattern has a narrower width than the first and second widths of the respective first and second conductive patterns.

11. The semiconductor device of claim 10, wherein the first insulator and the first insulating layer form a continuous structure without boundaries therebetween.

12. The semiconductor device of claim 11, wherein the first insulator and the first insulating layer are insulating layers formed by an atomic layer deposition (ALD).

13. The semiconductor device of claim 10, wherein there is a discontinuity surface between the first insulating layer and the second insulating layer and there is no discontinuity surface between the first insulator and the first insulating layer.

14. The semiconductor device of claim 10, wherein the sub-pattern is electrically insulated from the first conductive pattern.

15. The semiconductor device of claim 14, wherein the first pattern comprises two or more sub-patterns extending in the same direction, and a part of the first insulator is between the two or more sub-patterns.

16. The semiconductor device of claim 10, wherein the first pattern is formed at a vertical level equal to a vertical level of the first conductive pattern, and
wherein the first insulator surrounds the sub-pattern in a plan view.

17. The semiconductor device of claim 16, wherein the first pattern comprises a plurality of island patterns each of which is surrounded by the first insulator.

18. The semiconductor device of claim 10, wherein the first conductive pattern and the second conductive pattern are formed at the same vertical level,
wherein the first conductive pattern and the second conductive pattern are separated from each other by an isolation pattern, and
the isolation pattern meets the first pattern.

19. The semiconductor device of claim 18, wherein the first conductive pattern comprises a first recess portion in contact with at least three side surfaces of the first pattern, and
the second conductive pattern comprises a second recess portion in contact with at least three side surfaces of the first pattern.

20. A semiconductor device comprising:
a first horizontal electrode extending in a first direction on a semiconductor substrate and disposed at a first vertical height above the semiconductor substrate;
a second horizontal electrode extending in the first direction and spaced apart from the first horizontal electrode, the second horizontal electrode disposed at the same first vertical height above the semiconductor substrate as the first horizontal electrode;
a first pattern disposed between the first horizontal electrode and the second horizontal electrode, the first pattern electrically insulating the first horizontal electrode from the second horizontal electrode; and
a conductor and an insulator stacked on the first horizontal electrode, the second horizontal electrode, and the first pattern,
wherein the first pattern comprises a plurality of sub-patterns spaced apart from each other,
wherein the plurality of sub-patterns have a conductive material different from a material of the first and second horizontal electrodes,
wherein the sub-patterns are spaced apart from the first and second horizontal electrodes, and
wherein the spaced apart distances between adjacent sub-patterns of the plurality of sub-patterns and the respective spaced apart distances between the sub-patterns and the horizontal electrodes are about 3 nm to about 100 nm.

* * * * *